US011573324B2

(12) United States Patent
Koduri

(10) Patent No.: US 11,573,324 B2
(45) Date of Patent: Feb. 7, 2023

(54) LIDAR IMAGING RECEIVER

(71) Applicant: Texas Instruments Incorporated, Dallas, TX (US)

(72) Inventor: Sreenivasan K. Koduri, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1044 days.

(21) Appl. No.: 16/203,170

(22) Filed: Nov. 28, 2018

(65) Prior Publication Data
US 2020/0166645 A1 May 28, 2020

(51) Int. Cl.
*G01S 7/481* (2006.01)
*G01S 17/02* (2020.01)
(Continued)

(52) U.S. Cl.
CPC .............. *G01S 17/89* (2013.01); *G01S 7/003* (2013.01); *G01S 7/4811* (2013.01);
(Continued)

(58) Field of Classification Search
CPC ..... G01S 7/03; G01S 7/10; G01S 7/24; G01S 7/28; G01S 7/295; G01S 7/352; G01S 7/42; G01S 7/4811; G01S 7/4816; G01S 7/486; G01S 7/4912; G01S 7/4914; G01S 17/02; G01S 17/04; G01S 17/06; G01S 17/08; G01S 17/10; G01S 17/26; G01S 17/32; G01S 17/34; G01S 17/36; G01S 17/48;
(Continued)

(56) References Cited

U.S. PATENT DOCUMENTS 5,604,695 A * 2/1997 Cantin .................. G01S 3/7835
250/206.2
6,127,714 A * 10/2000 Mochizuki ............ H01L 25/167
250/208.1
(Continued)

FOREIGN PATENT DOCUMENTS

DE 19910120 A1 * 9/2000 ............ G01J 5/0025
EP 3318895 A1 * 5/2018 ........... G01S 7/4863

OTHER PUBLICATIONS

Wikipedia, Beam splitter, Mar. 21, 2017 (Year: 2017).*
(Continued)

*Primary Examiner* — Daniel L Murphy
(74) *Attorney, Agent, or Firm* — Frank D. Cimino

(57) ABSTRACT

Described examples include a receiver having a beam splitter arranged to receive reflected light from a scene illuminated by a transmitted light signal, the beam splitter structured to provide at least two copies of the reflected light including at least two regions having sub-regions, wherein the sub-regions are not adjacent to each other. The receiver also includes a first sensor array arranged to receive one region of the reflected light and provide an output representative of that region of the reflected light. The receiver also includes a second sensor array arranged to receive the other region of the reflected light and provide a second output representative of the second region of the reflected light. The receiver also includes a combiner arranged to receive the outputs of the sensor arrays to provide a combined representation of the reflected light.

23 Claims, 18 Drawing Sheets

(51) Int. Cl.
*G01S 17/89* (2020.01)
*G01S 17/10* (2020.01)
*H01L 31/107* (2006.01)
*G01S 7/00* (2006.01)
*G01S 17/86* (2020.01)

(52) U.S. Cl.
CPC ............ *G01S 7/4817* (2013.01); *G01S 17/10* (2013.01); *G01S 17/86* (2020.01); *H01L 31/107* (2013.01)

(58) Field of Classification Search
CPC ........ G01S 17/96; G01S 17/89; G01S 7/4817; G01S 7/003; G01S 17/023; G01S 17/86; G01S 17/894; H01L 31/107
USPC ........................................................ 356/5.01
See application file for complete search history.

(56) References Cited

U.S. PATENT DOCUMENTS

| | | | |
|---|---|---|---|
| 7,760,334 B1 * | 7/2010 | Evans | G01S 7/499 356/4.01 |
| 7,969,558 B2 | 6/2011 | Hall | |
| 9,995,821 B2 * | 6/2018 | Tang | G01S 15/8915 |
| 10,564,266 B2 * | 2/2020 | O'Keeffe | G01S 7/497 |
| 2010/0235095 A1 * | 9/2010 | Smitherman | G01S 19/14 701/532 |
| 2017/0003392 A1 | 1/2017 | Bartlett et al. | |
| 2017/0122801 A1 * | 5/2017 | Costello | G01J 1/46 |
| 2017/0219696 A1 | 8/2017 | Hayakawa et al. | |
| 2020/0158832 A1 * | 5/2020 | Kirillov | G01S 17/42 |
| 2021/0311193 A1 * | 10/2021 | Schnitzer | G01S 17/89 |

OTHER PUBLICATIONS

Baltsavias "Airbone laser scanning: basic relations and formulas," ISPRS J Photogramm Remote Sens (1999) 54:199-214. doi:10.1016/S0924-2716(99)00015-5 Elsevier B.V., Radarweg 29, 1043 NX Amsterdam, The Netherlands, http://www2.geog.ucl.ac.uk/~mdisney/teaching/teachingNEW/PPRS/papers/Baltsavias_Lidar.pdf.

* cited by examiner

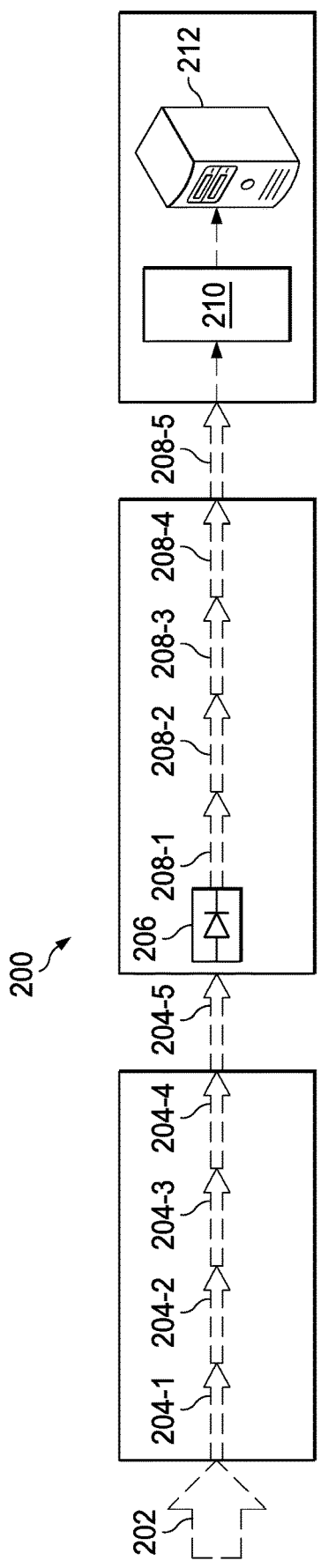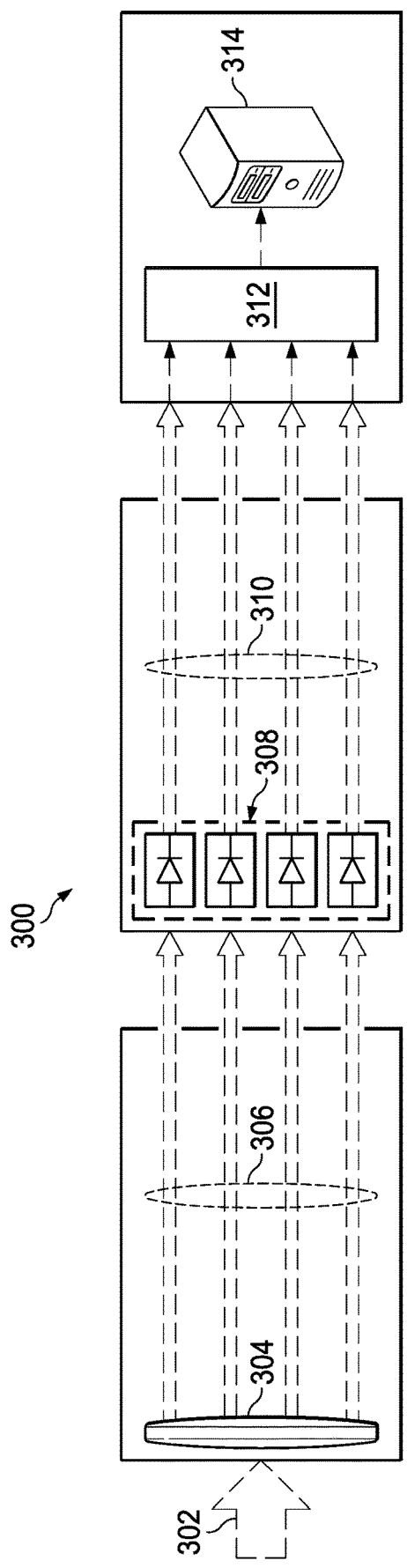

LIDAR IMAGING RECEIVER

TECHNICAL FIELD

This relates generally to lidar, and more particularly to reception of lidar signals.

BACKGROUND

Lidar is a ranging technology used to estimate distance to a target based on transmitting light energy. Typical lidar systems operate by reflecting a transmitted narrow pulse of light off a target and estimating the amount of time it takes the pulse to return. An alternative approach is amplitude modulated continuous wave (AMCW) based lidar. In AMCW lidar, the transmitter modulates the intensity of the light with a continuous wave (CW) signal. The receiver typically estimates the time of flight based on the phase of the received CW signal relative to the transmitted CW signal.

As noted hereinabove, lidar (also called LIDAR, LiDAR, and LADAR) is a method for measuring distance to a target by illuminating that target with a light such as laser light. The name lidar is sometimes considered an acronym of Light Detection And Ranging or Light Imaging, Detection, And Ranging. Lidar was originally a portmanteau of the words "light" and "radar." In lidar systems, a source transmits light into a field of view and the light reflects off objects. Sensors receive the reflected light. In some lidar systems, a flash of light illuminates an entire scene. In such flash lidar systems, arrays of time-gated photodetectors receive reflections from objects illuminated by the light, and the time it takes for the reflections to arrive at various sensors in the array is determined. In an alternative approach, a scan such as a raster scan can illuminate a scene in a continuous scan fashion. A source transmits light or light pulses during the scan. Sensors that can also scan the pattern, or fixed sensors directed towards the field of view, receive reflected pulses from objects illuminated by the light. The light can be a scanned beam or moving spot. Time-of-flight computations can determine the distance from the transmitter to objects in the field of view that reflect the light. The time-of-flight computations can create distance and depth maps. Light scanning and lidar applications include: ranging; metrology; mapping; surveying; navigation; microscopy; spectroscopy; object scanning; and industrial applications. Recently, lidar applications also include: security; robotics; industrial automation; and mobile systems. Vehicles use lidar navigation and collision avoidance systems. Autonomous vehicles and mobile robots use lidar for collision avoidance and scene detection.

The need to use highly sensitive photodetectors, such as avalanche photodiodes, limits lidar receiving systems. It is difficult and expensive to make large arrays of such photodetectors. Therefore, systems use mechanical devices, such as moving mirrors, to detect reflected light from a scene piecewise to one or a few photodetectors. Alternatively, a circuit board may include multiple small photodetector arrays. However, this technique suffers from a low fill factor, causing aliasing and other problems.

SUMMARY

In accordance with an example, a receiver includes a beam splitter arranged to receive reflected light from a scene illuminated by a transmitted light signal. The beam splitter is structured to provide at least a first copy of the reflected light and a second copy of the reflected light, the first and second copies of the reflected light including: at least a first region having first sub-regions; and a second region having second sub-regions, wherein the first sub-regions are not adjacent to each other and the second sub-regions are not adjacent to each other. The receiver also includes a first sensor array arranged to receive the first region of the first copy of the reflected light and provide a first output representative of the first region of the first copy of the reflected light. The receiver also includes a second sensor array arranged to receive the second region of the second copy of the reflected light and provide a second output representative of the second region of the second copy of the reflected light. The receiver also includes a combiner arranged to receive the first output and the second output, the combiner arranged to combine the first output and the second output to provide a representation of the reflected light.

BRIEF DESCRIPTION OF THE DRAWINGS

FIG. 2 is a schematic diagram illustrating serial operation of a lidar such as the lidar of FIG. 1.

FIG. 3 is a schematic diagram illustrating parallel operation of a lidar.

DETAILED DESCRIPTION

Corresponding numerals and symbols in the different figures generally refer to corresponding parts unless otherwise indicated. The figures are not necessarily drawn to scale.

The term "coupled" may include connections made with intervening elements, and additional elements and various connections may exist between any elements that are "coupled."

Figure 1:
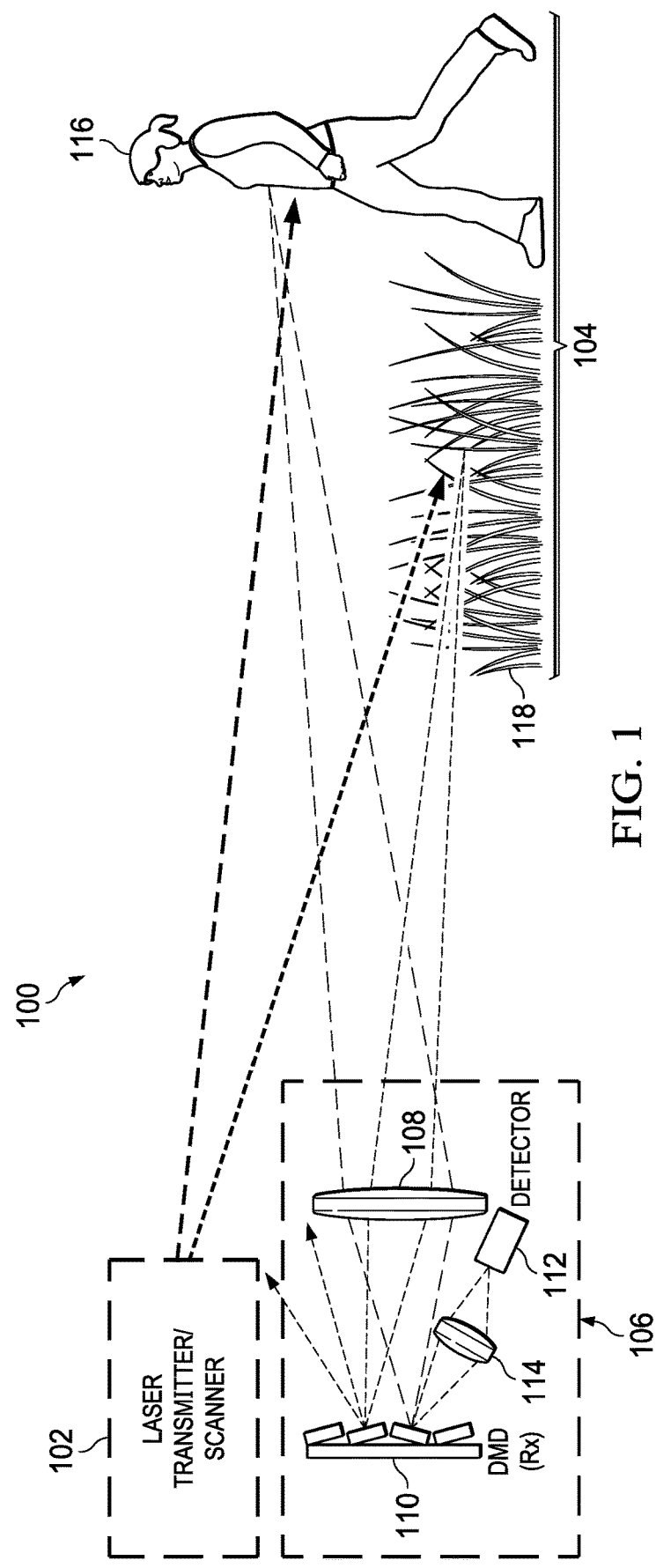
FIG. 1 is a schematic diagram of an example lidar.

FIG. 1 is a schematic diagram of an example lidar 100. Transmitter 102 illuminates a scene 104 with light modulated with a signal. The modulated light produced by transmitter 102 may flood the entire scene, illuminate selected portions of the scene, and raster scan the scene or provide the light in other configurations. The signal used to modulate the light includes an encoding, such as a pulse, a series of pulses or continuous wave encoding, to allow the receiver 106 to discriminate light provided by transmitter 102 from ambient light that is received and to determine the time-of-flight of the light from the transmitter 102, reflection at the scene 104 and back to the receiver 106. Baltsavias, "Airborne Laser Scanning: Basic Relations and Formulas," ISPRS Journal of Photogrammetry & Remote Sensing 54 (1999) 199-214, which is hereby incorporated herein by reference in its entirety, describes examples of such determinations.

In the example lidar 100, receiver 106 includes a focusing lens 108 and a digital micromirror device (DMD) 110. DMD 110 allows for selective reflection of reflected light from the scene onto photodetector 112 through lens 114. For example, in FIG. 1, mirrors on DMD 110 select the light reflected off object 116. Light from other objects like object 118 reflect away from the photodetector 112. At other times, the mirrors of DMD 110 select reflected light from other portions of the scene. In this manner, photodetector 112 receives the reflected light from the entire scene in a serial manner; that is, one portion of the reflected light from the scene after another. However, because the detection of reflected light from each portion of the scene by photodetector 112 is time limited, the time for accumulation of photons into photodetector 112 is limited. Thus, photodetector 112 must be very sensitive. In addition, the reflected light is directed to photodetector 112 by mechanical manipulation of mirrors. In some examples, one mirror is used to direct the reflected light. In the example of lidar 100, DMD mirrors are used to direct the reflected light. Mechanical devices are prone to failure and require additional power.

FIG. 2 is a schematic diagram illustrating serial operation of a lidar 200 like lidar 100 (FIG. 1). Reflected light 202 from the scene is provided in serial portions 204-1 through 204-5 to photodetector 206. Photodetector 206 converts the light from serial portions 204-1 through 204-5 to electrical signals 208-1 through 208-5 that are stored in buffer 210 until the reflected light from the full scene is detected. The electrical signals representing the reflected light from the full scene is then provided to processor 212 for processing and object detection.

FIG. 3 is a schematic diagram illustrating parallel operation of a lidar 300 as further described hereinbelow. Beam splitter 304 divides reflected light 302 from the scene into four copies 306 of reflected light 302. Photodetectors 308 receive copies 306. Photodetectors 308 provide electrical signals 310 to buffer 312. The four copies 306 will each have one quarter of the light intensity of reflected light 302. However, this is compensated by the additional accumulation time for photodetectors 308. The electrical signals for the reflected light from the full scene are combined in buffer 312 and provided to processor 314 for processing and object detection.

Figure 4:
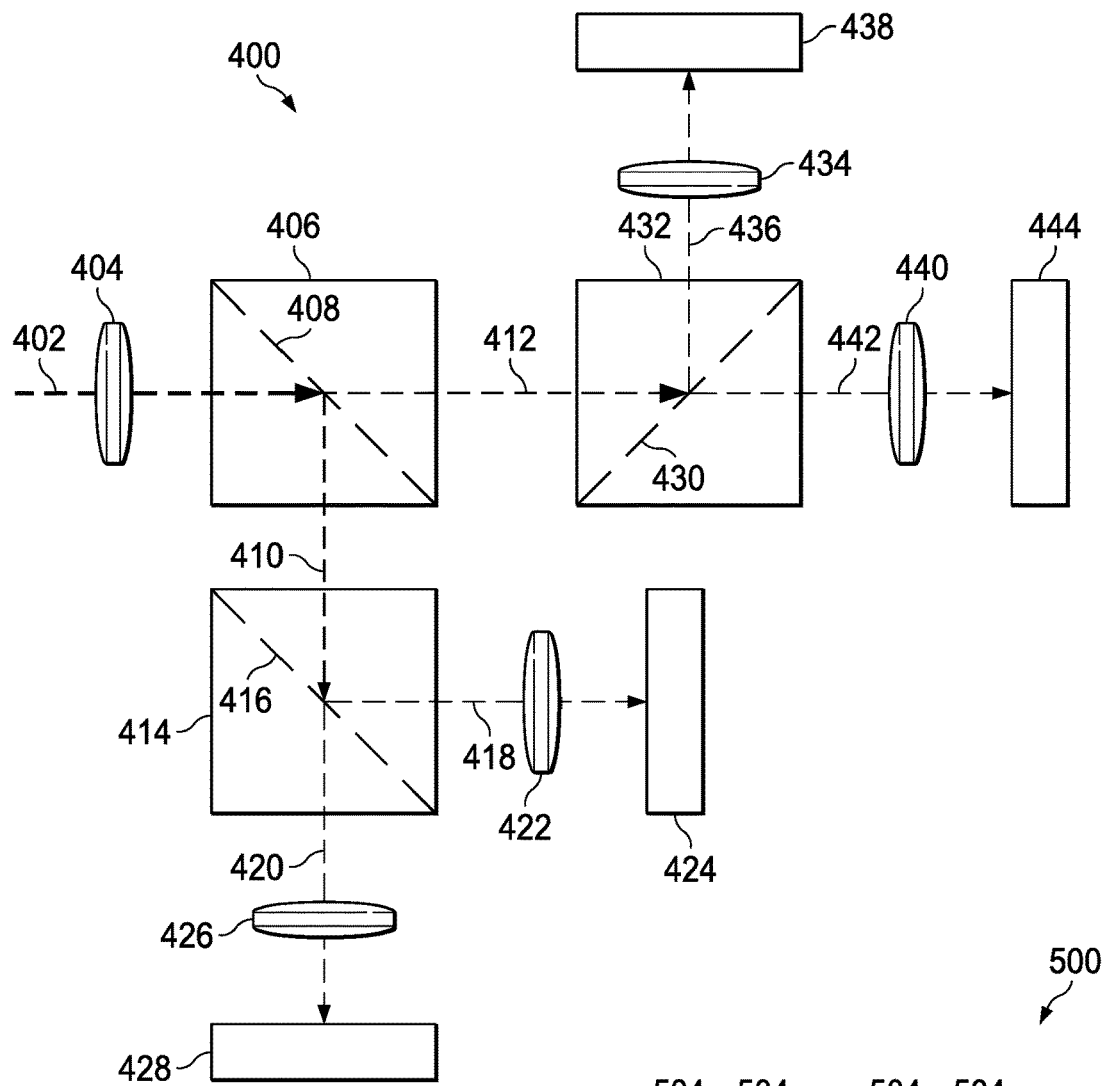
FIG. 4 is a diagram of an example beam splitter.

FIG. 4 is a diagram of an example beam splitter 400. Lens group 404 focuses reflected light 402 from the scene onto beam splitter 406. Beam splitter 406 includes splitting layer 408, which has a forty-five-degree angle relative to the path of reflected light 402. Splitting layer 408 in this example is a half-mirror layer. Splitting layer 408 reflects half of reflected light 402 as light 410 and passes the other half of reflected light 402 as light 412. FIG. 4 illustrates the splitting by the ray lines representing light 410 and 412 that are half the thickness of the ray line representing reflected light 402. Light 410 enters beam splitter 414 where splitting layer 416 reflects half of light 410 as light 418 and the other half of light 412 passes through splitting layer 416 as light 420. Lens group 422 focuses light 418 onto sensor array 424. Lens group 426 focuses light 420 onto sensor array 428. Similarly, light 412 is split by splitting layer 430 of beam splitter 432. Lens group 434 focuses reflected light 436 onto sensor array 438 and lens group 440 focuses transmitted light 442 onto sensor array 444. Thus, each of sensory arrays 424, 428, 438 and 444 receives a copy of reflected light 402 in the form of light 418, light 420, light 436 and light 442, respectively. The configuration of sensor arrays 424, 428, 438 and 444 is further explained hereinbelow. Beam splitters 406, 414 and 432 are cube beam splitters with half-mirror layers in this example. However, other beam splitting technologies may be suitably employed. Beam splitters are commercially available from, for example, Thorlabs, Inc.

Figure 5:
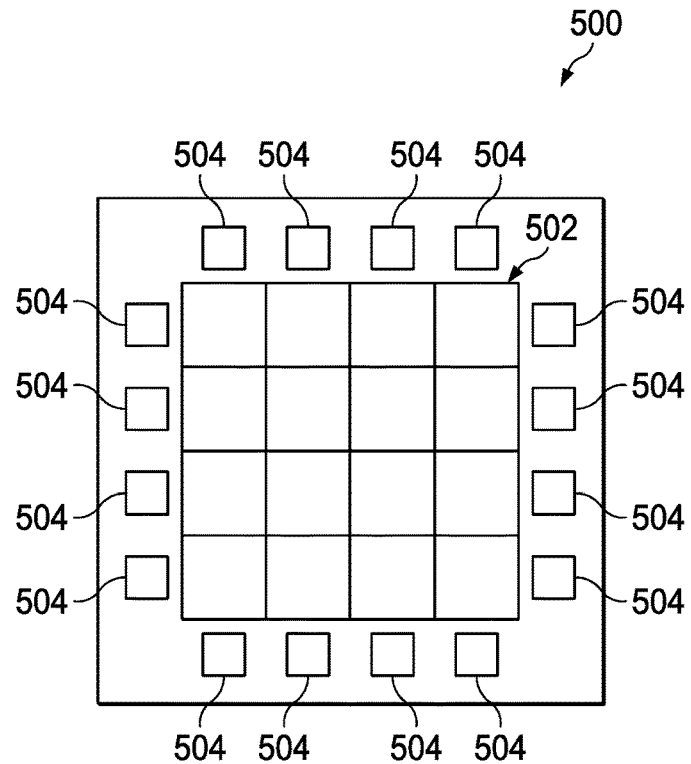
FIG. 5 is a diagram of an example sensor element.

FIG. 5 is a diagram of an example sensor element 500. Sensor element 500 includes an array 502 of avalanche photodiodes. Array 502 in the example of FIG. 5 includes 16 avalanche photodiodes. Lidar uses avalanche photodiodes because of the high sensitivity of these devices. Because of scattering, interference and other effects, the light signal from the transmitter (for example, transmitter 102 (FIG. 1)) is weak after reflecting off the objects in the scene. Therefore, lidar uses sensitive photosensors. However, it is not commercially feasible to make large arrays of avalanche photodiodes. Therefore, multiple sensor elements like sensor element 500 with a small number of avalanche photodiodes are used as explained hereinbelow. Sensor element 500 also includes contact pads 504 to provide electrical connection to the array 502 of avalanche diodes.

Figure 6:
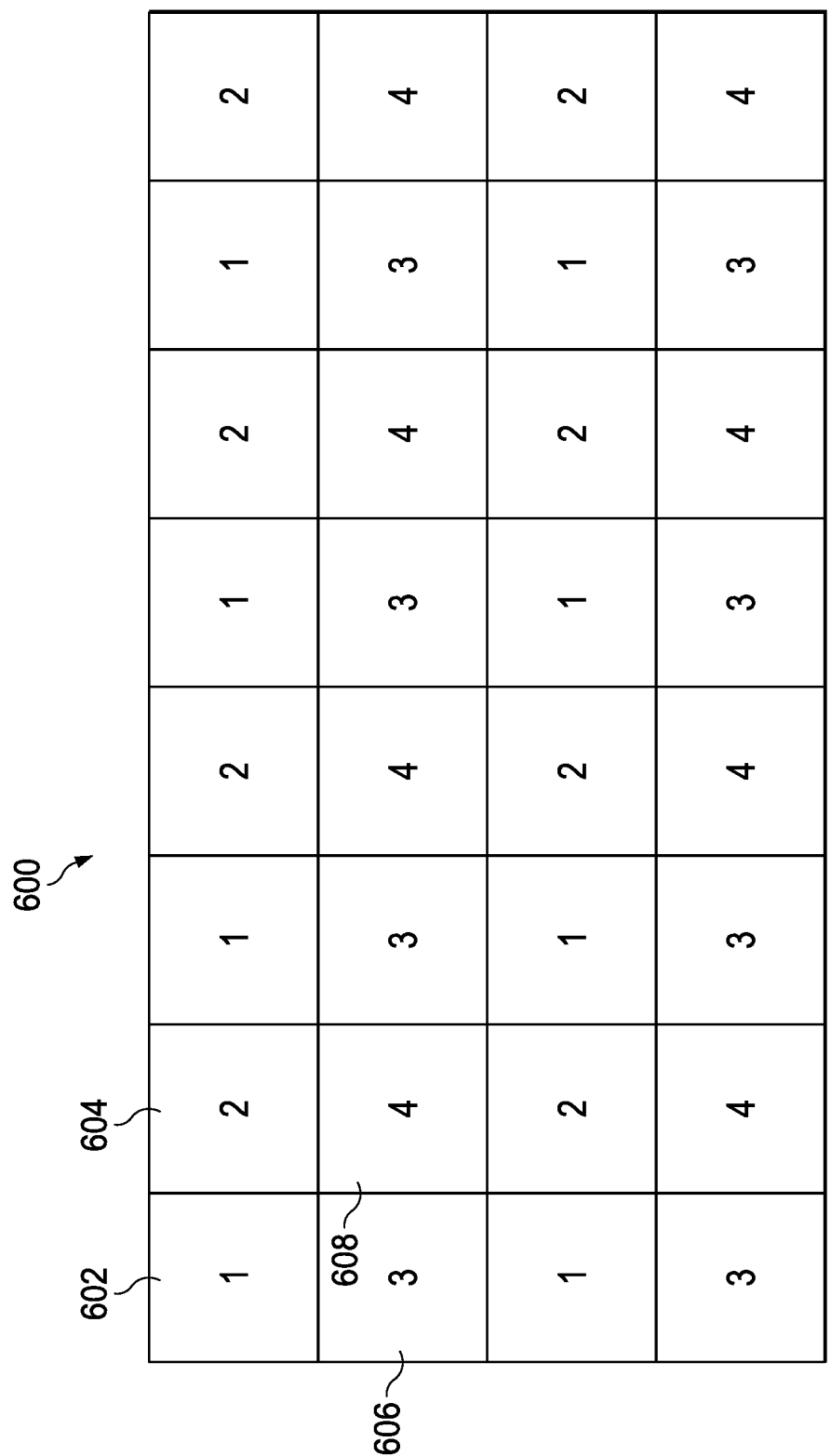
FIG. 6 is a diagram of an example of reflected light from a scene.

FIG. 6 is a diagram of an example reflected light 600 from the scene. Reflected light 600 represents the image provided by light reflected from the scene, like reflected light 402 (FIG. 4). Four sets of regions divide reflected light 600, in this example. Set 1 is regions 602 (labeled "1"). Set 2 is regions 604 (labeled "2"). Set 3 is regions 606 (labeled "3"). Set 4 is regions 608 (labeled "4"). For clarity, FIG. 6 only includes reference numbers to one group of the regions on the top left. In this example, no region is adjacent to a region in its set. For example, region 608 is in set 4. Every region adjacent to region 608 is in set 1, set 2 or set 3.

Figure 7:
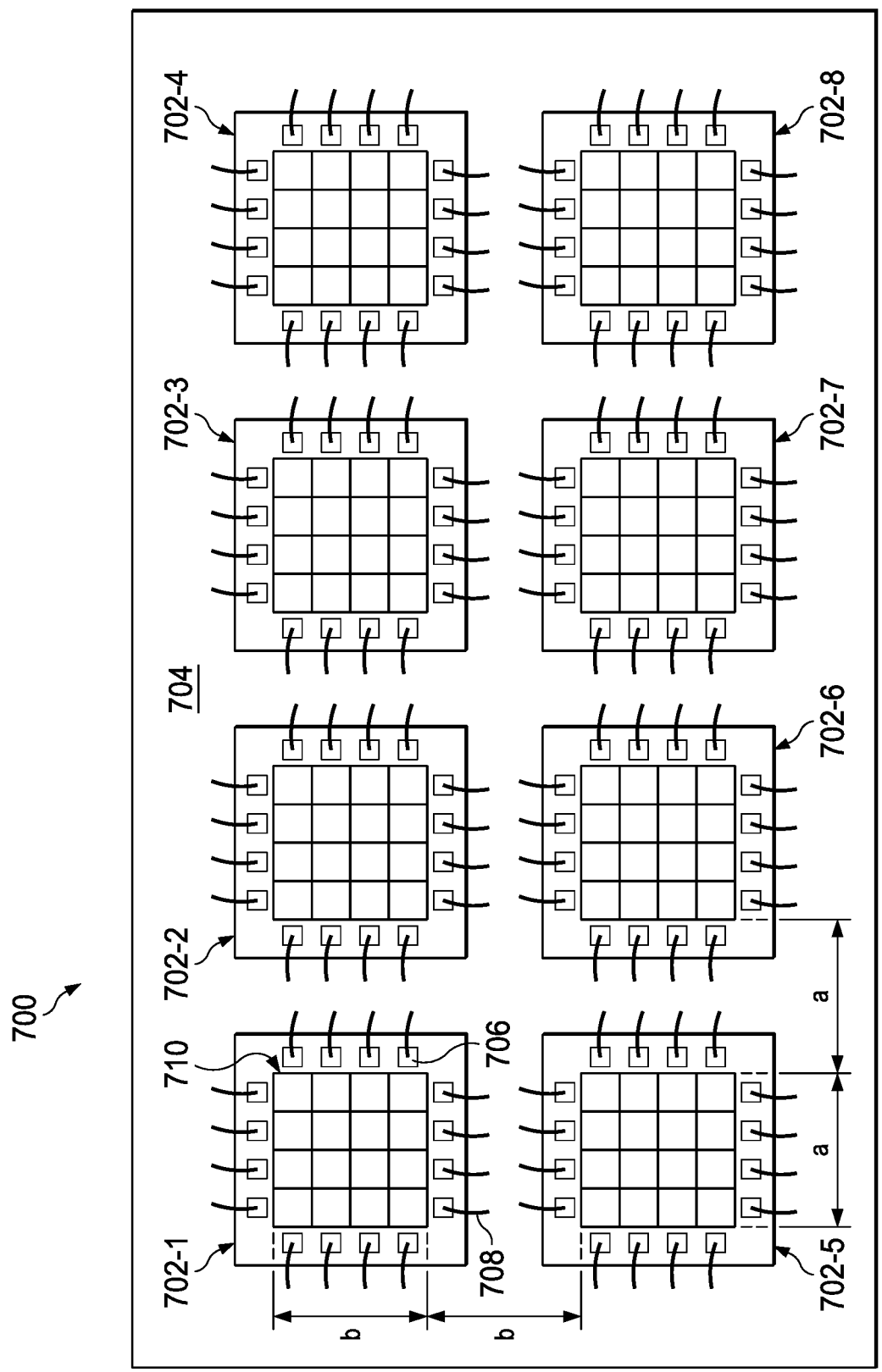
FIG. 7 is a schematic diagram of an example sensor array.

FIG. 7 is a schematic diagram of an example sensor array 700. In this example, sensor elements 702-1 through 702-8 mount to circuit board 704. Each of sensor elements 702-1 through 702-8 includes bond pads 706 with wire bonds 708 to connect sensor elements 702-1 through 702-8 to circuit board 704. Also, in this example, each of sensor elements 702-1 through 702-8 includes sixteen avalanche photodiodes 710 in a matrix arrangement. For clarity, FIG. 7 only includes reference numbers for one set of bond pads 706, wire bonds 708 and for one matrix of avalanche photodiodes 710. In this example, the distance between the matrixes of avalanche photodiodes 710 in sensor array 700 is equal to the height and width of the matrixes. That is, width "a" is the width of a matrix and is also the width from the edge of one matrix to the next matrix, as shown in FIG. 7. Similarly, height "b" is the height of one matrix and is also the height from the edge of one matrix to the other. This arrangement provides space between sensor elements 702-1 through 702-8 that allows for the use of relatively inexpensive wire bonding for connecting sensor elements 702-1 through 702-8 to circuit board 704, as opposed to more expensive techniques such as through silicon via (TSV). However, sensor array 700 by itself provides a very poor fill factor because of the large space between the sensor elements.

Figure 8A:
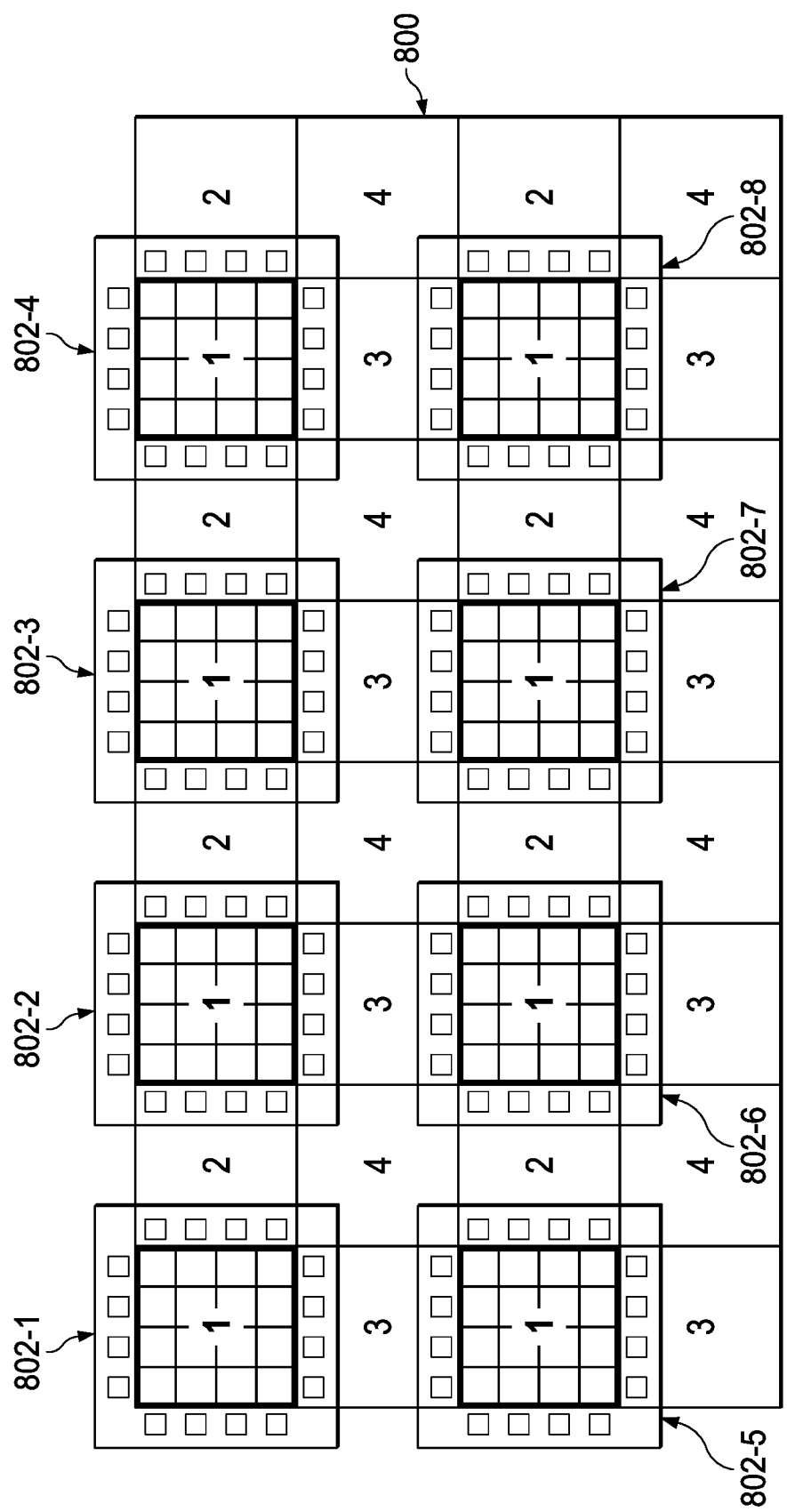
FIGS. 8A-D (collectively "FIG. 8") are diagrams of example positions of sensor arrays like the sensor array of FIG. 7.
Figure 8B:
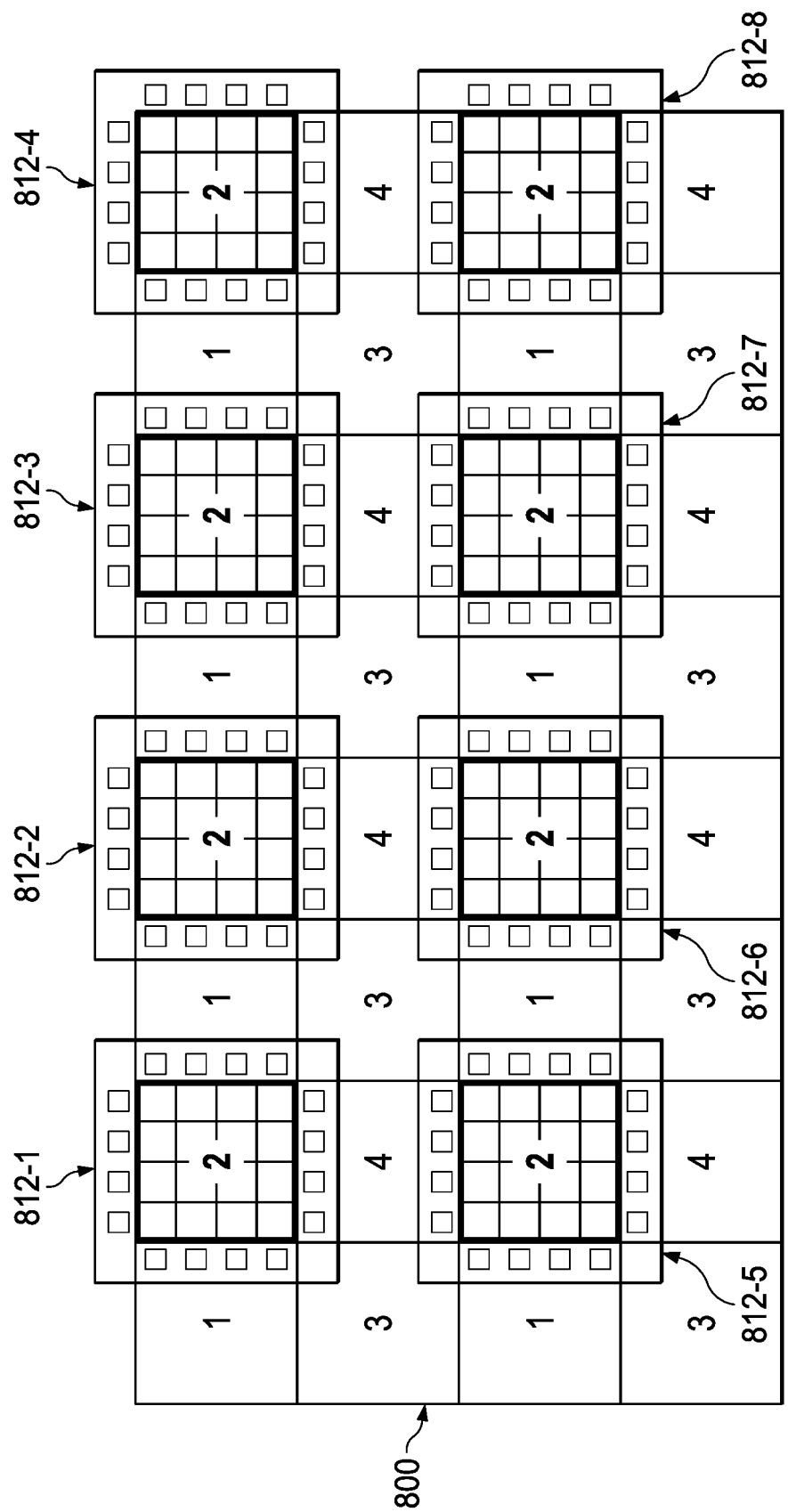
Figure 8C:
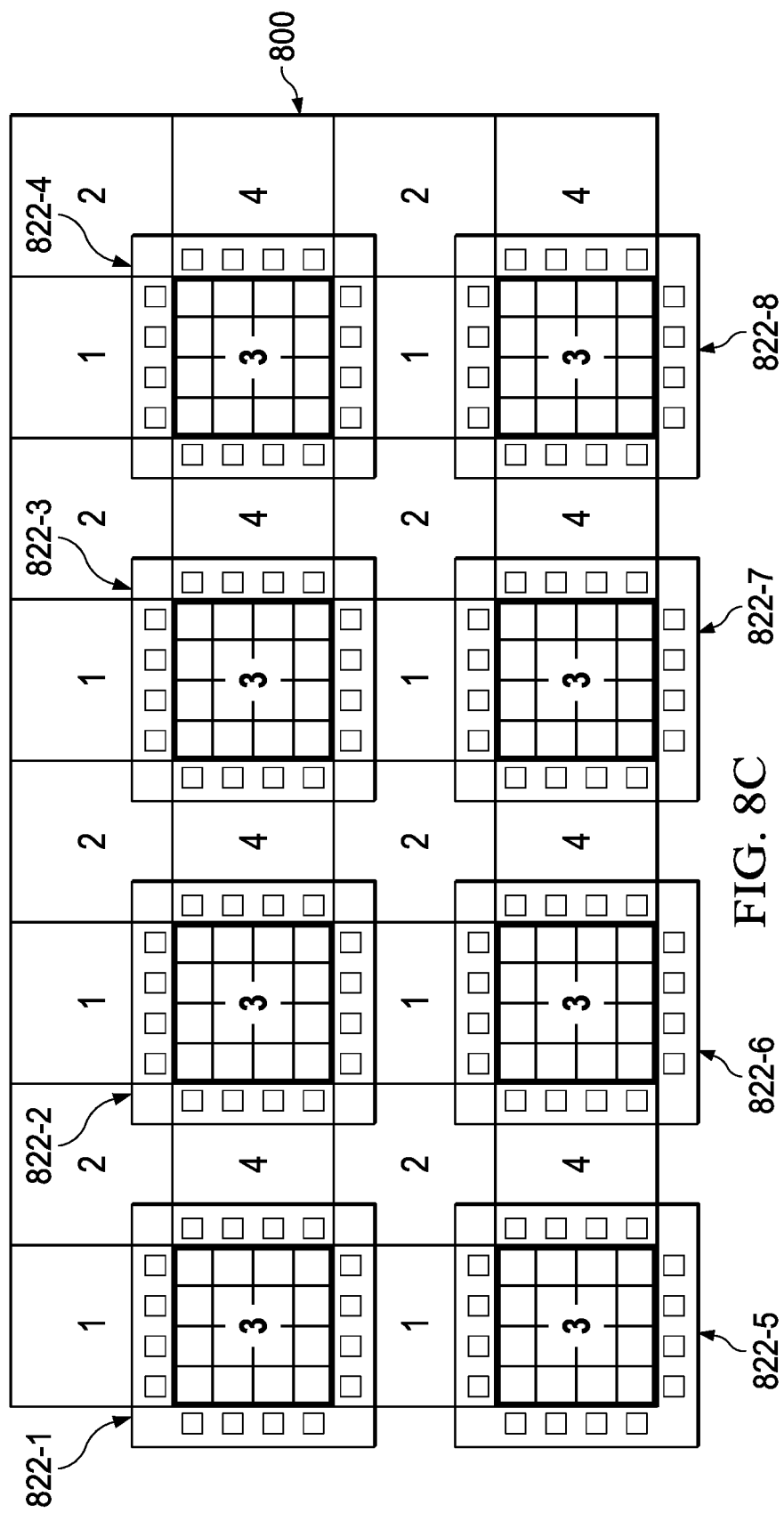
Figure 8D:
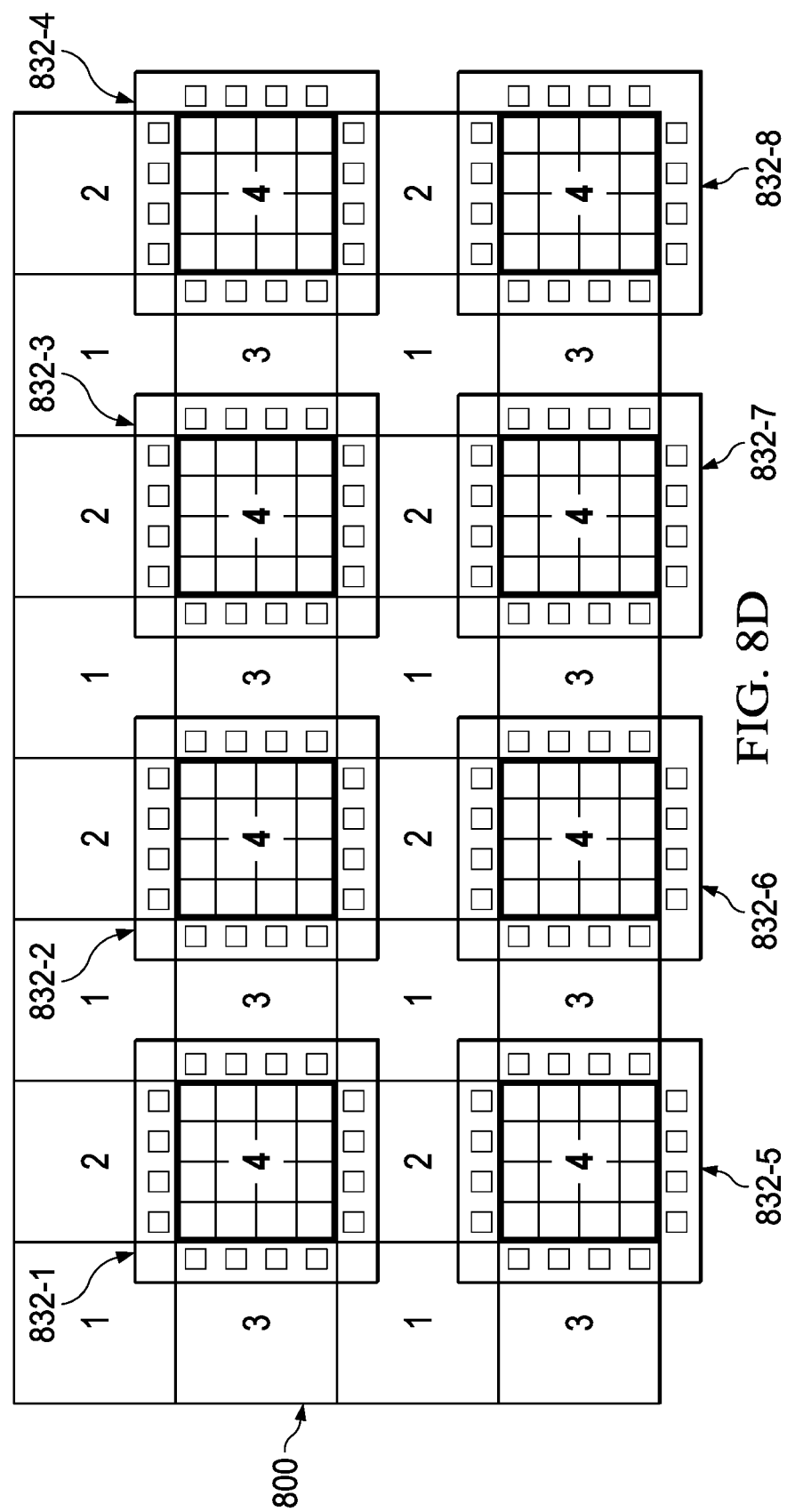

FIGS. 8A-D are diagrams of example positions of sensor arrays like sensor array 700 (FIG. 7) within an arrangement like beam splitter 400 (FIG. 4). In this example, sensor elements 802-1 through 802-8 are like sensor elements 702-1 through 702-8 (FIG. 7) with circuit board 704 omitted for clarity. Reflected light 800 is like reflected light 600 (FIG. 6). Like reflected light 600, reflected light 800 includes regions assigned to set 1, set 2, set 3 and set 4. In FIG. 8A, the position of a sensor array including sensor elements 802-1 through 802-8 is such that sensor elements 802-1 through 802-8 receive the light from the regions in set 1. For example, if the sensor array 438 (FIG. 4) is the sensor array that contains sensor elements 802-1 through 802-8, the reflected light for the full scene provided by light 436 illuminates sensor array 438. However, the position of sensor elements 802-1 through 802-8 are at the regions of set 1, as highlighted in FIG. 8A. Therefore, the sensory array of FIG. 8A only senses the reflected light of the regions of set 1. Similarly, if sensor array 444 (FIG. 4) is the sensor array that contains sensor elements 812-1 through 812-8 of FIG. 8B, the position of sensor elements 812-1 through 812-8 are at the regions of set 2. Therefore, the sensor array of FIG. 8B only senses the reflected light of the regions of set 2. Similarly, if sensor array 424 (FIG. 4) is the sensor array that contains sensor elements 822-1 through 822-8 of FIG. 8C, the position of sensor elements 822-1 through 822-8 are at the regions of set 3. Therefore, the sensor array of FIG. 8C only senses the reflected light of the regions of set 3. Finally, if sensor array 428 (FIG. 4) is the sensor array that contains sensor elements 832-1 through 832-8 of FIG. 8D, the position of sensor elements 832-1 through 832-8 are at the regions of set 4. Therefore, the sensor array of FIG. 8D only senses the reflected light of the regions of set 4.

Figure 9:
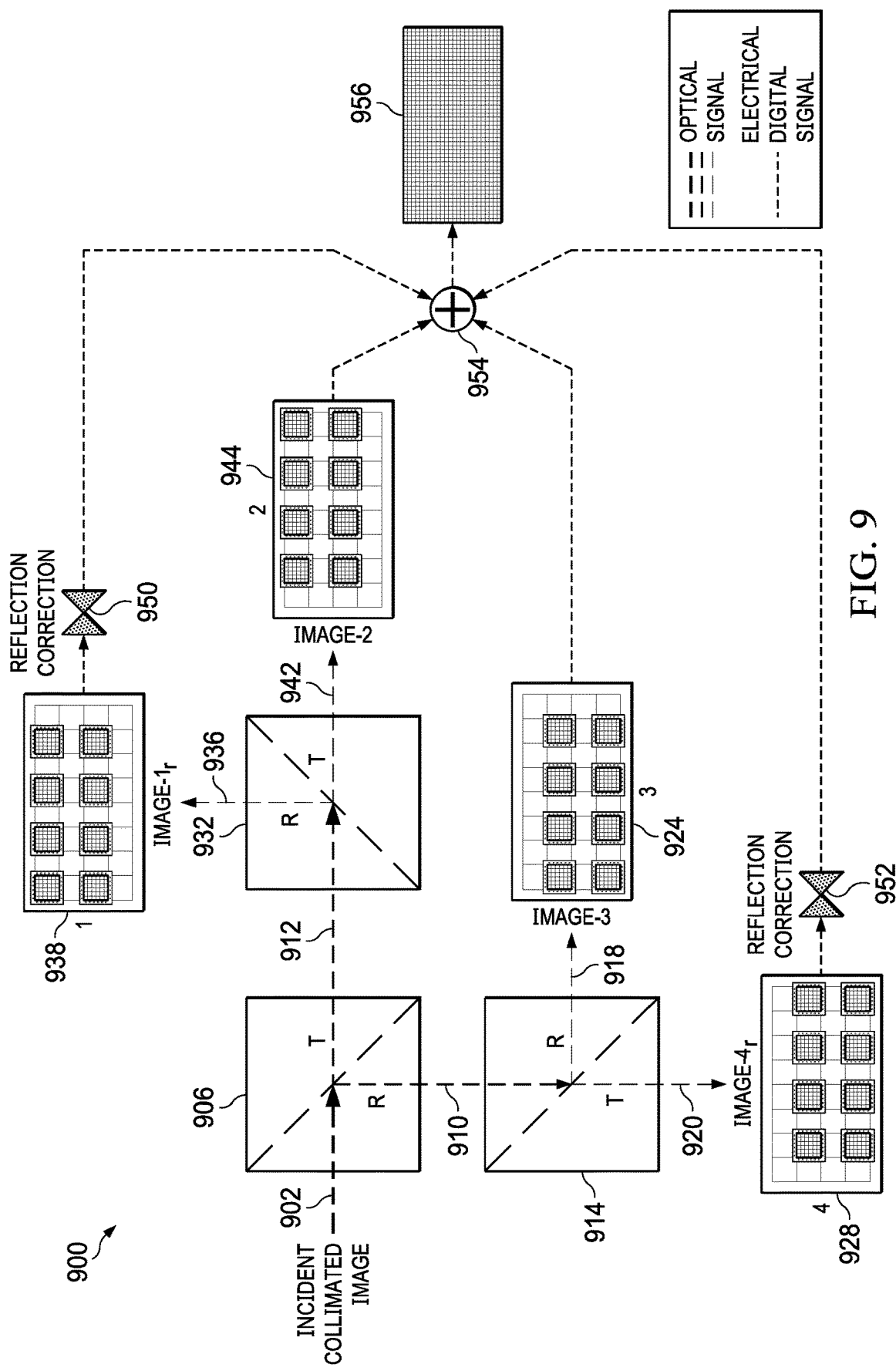
FIG. 9 is a schematic diagram of an example receive section.

FIG. 9 is a schematic diagram of an example receive section 900 of a lidar using the hereinabove explained concepts. Reflected light 902 is light reflected from the scene. Beam splitter 906 splits reflected light 902 into light 910 and light 912. Beam splitter 914 splits light 910 into light 918 and light 920. Beam splitter 932 splits light 912 into light 936 and light 942. Sensor array 938 receives light 936 in the regions of set 1. Sensor array 944 receives light 942 in the regions of set 2. Sensor array 924 receives light 918 in the regions of set 3. Sensor array 928 receives light 920 in the regions of set 4. Because light 936 and 920 reflect once by beam splitters 932 and 906, respectively, the scene information of light 936 and 920 is the reverse of that of light 918, which reflects twice in beam splitters 906 and 914, and light 942, which does not reflect. Therefore, reflection corrector 950 reverses the scene of light 936 and reflection corrector 952 reverses the scene of light 920 in the electrical domain. Combiner 954 combines the data provided by sensor arrays 924, 928, 938 and 944 to produce a complete image 956. Assigning sensor arrays to sets of regions, where the regions are not adjacent to a region in the same set, allows for a near 100% fill factor of sensors in the image area of the reflected light, and allows for a relatively inexpensive sensor array configuration using, for example, wire bonding between the sensor elements to a circuit board. In addition, the example of FIG. 9 captures the reflected light using no moving parts.

Figure 10:
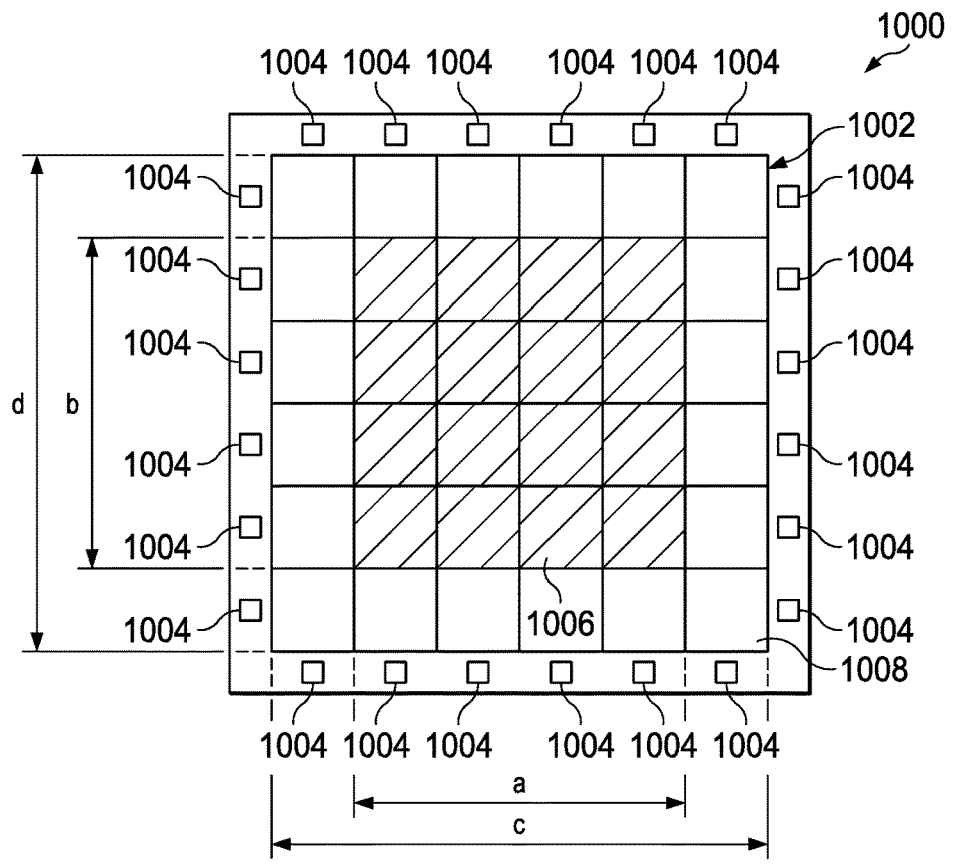
FIG. 10 is a diagram of another example sensor element.

FIG. 10 is a diagram of another example sensor element 1000. Sensor element 1000 includes an array 1002 of avalanche photodiodes. Array 1002 in the example of FIG. 10 only includes 36 avalanche photodiodes. However, it is not commercially feasible to make large arrays of avalanche photodiodes. Sensor element 1000 includes contact pads 1004 to provide electrical connection to the array 1002 of avalanche diodes. Array 1002 includes primary pixels 1006 (shaded) and surplus pixels 1008. Primary pixels 1006 are "a" wide by "b" high, which corresponds to the sensed region, as explained hereinbelow. Array 1002 overall is "c" wide (where c>a) and "d" high (where d>b). In this example, surplus pixels 1008 include two rows at the top and bottom of array 1002 and two columns at both sides of array 1002. The terms "top," "bottom" and "sides" are relative terms within FIG. 10 and do not refer to any other frame of reference. In other examples, surplus pixels may have other configurations, such as one column on one side of array 1002, one row on the top or bottom of array 1002 or an L-shape with the corner of the L at one corner of array 1002.

Figure 11:
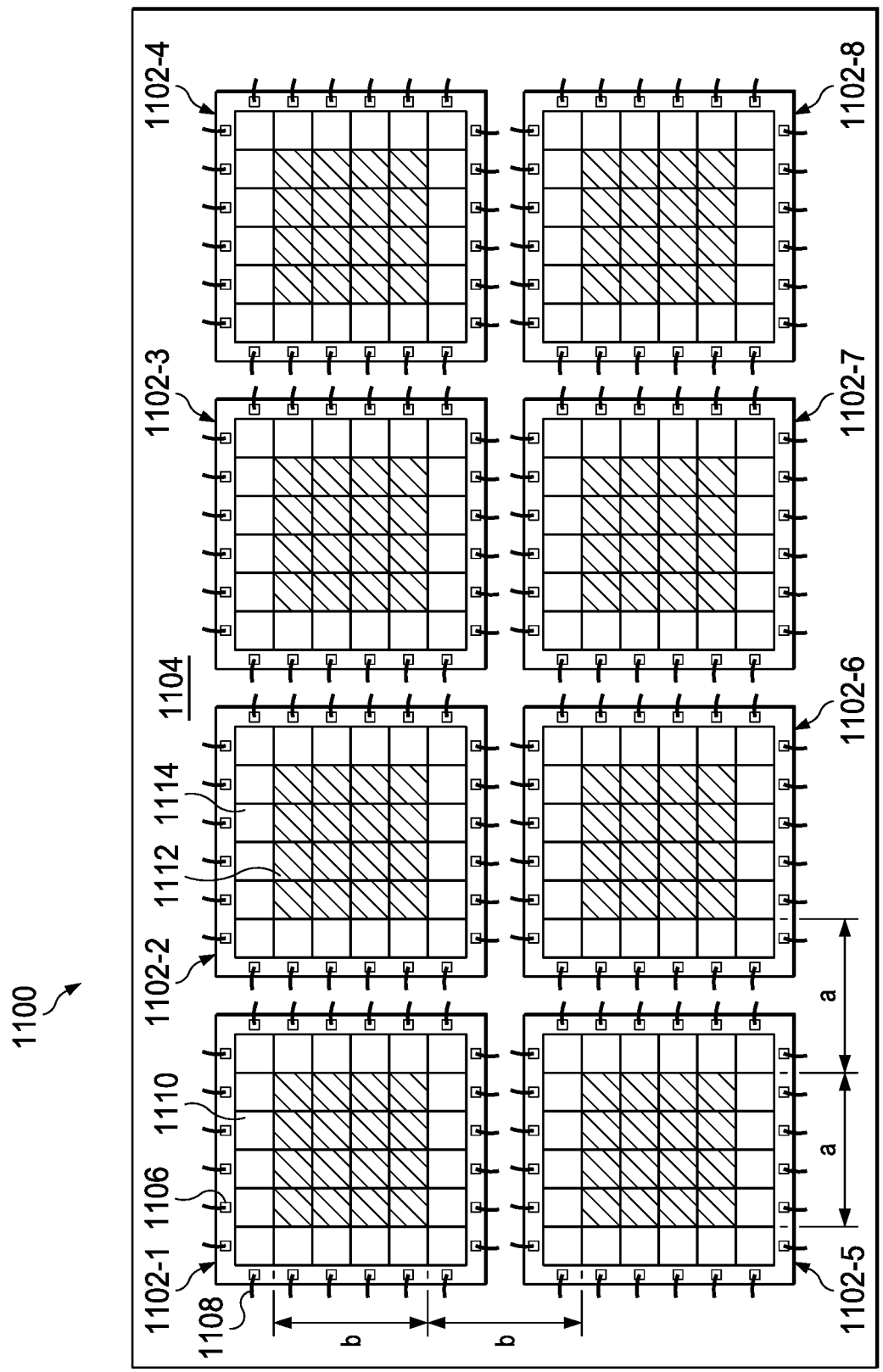
FIG. 11 is a schematic diagram of an example sensor array.

FIG. 11 is a schematic diagram of an example sensor array 1100. In this example, sensor elements 1102-1 through 1102-8 mount to circuit board 1104. Each of sensor elements 1102-1 through 1102-8 includes bond pads 1106 with wire bonds 1108 to connect sensor elements 1102-1 through 1102-8 to circuit board 1104. Also, in this example, each of sensor elements 1102-1 through 1102-8 includes an array 1110 having thirty-six avalanche photodiodes in a matrix arrangement. Like array 1002 (FIG. 10), each sensor element 1102-1 through 1102-8 includes an array 1110 that includes primary pixels 1112 and surplus pixels 1114. For clarity, FIG. 11 only includes reference numbers for one set of bond pads 1106, wire bonds 1108, one array 1110 having primary pixels 1112 and surplus pixels 1114. However, each sensor element includes these components in this example. The distance between the primary pixels 1112 in sensor array 1100 is equal to the height and width of the primary pixels 1112. That is, width "a" is the width of one set of primary pixels and is also the width from the edge of one set of primary pixels to the next set of primary pixels, as shown in FIG. 11. Similarly, height "b" is the height of one set of primary pixels and is also the height from the edge of one set of primary pixels to the next set of primary pixels. This arrangement provides space between sensor elements 1102-1 through 1102-8 that allows for the use of relatively inexpensive wire bonding for connecting sensor elements 1102-1 through 1102-8 to circuit board 1104, as opposed to more expensive techniques such as through silicon via (TSV). However, sensor array 1100 by itself provides a very poor fill factor because of the large space between the sensor elements.

Figure 12A:
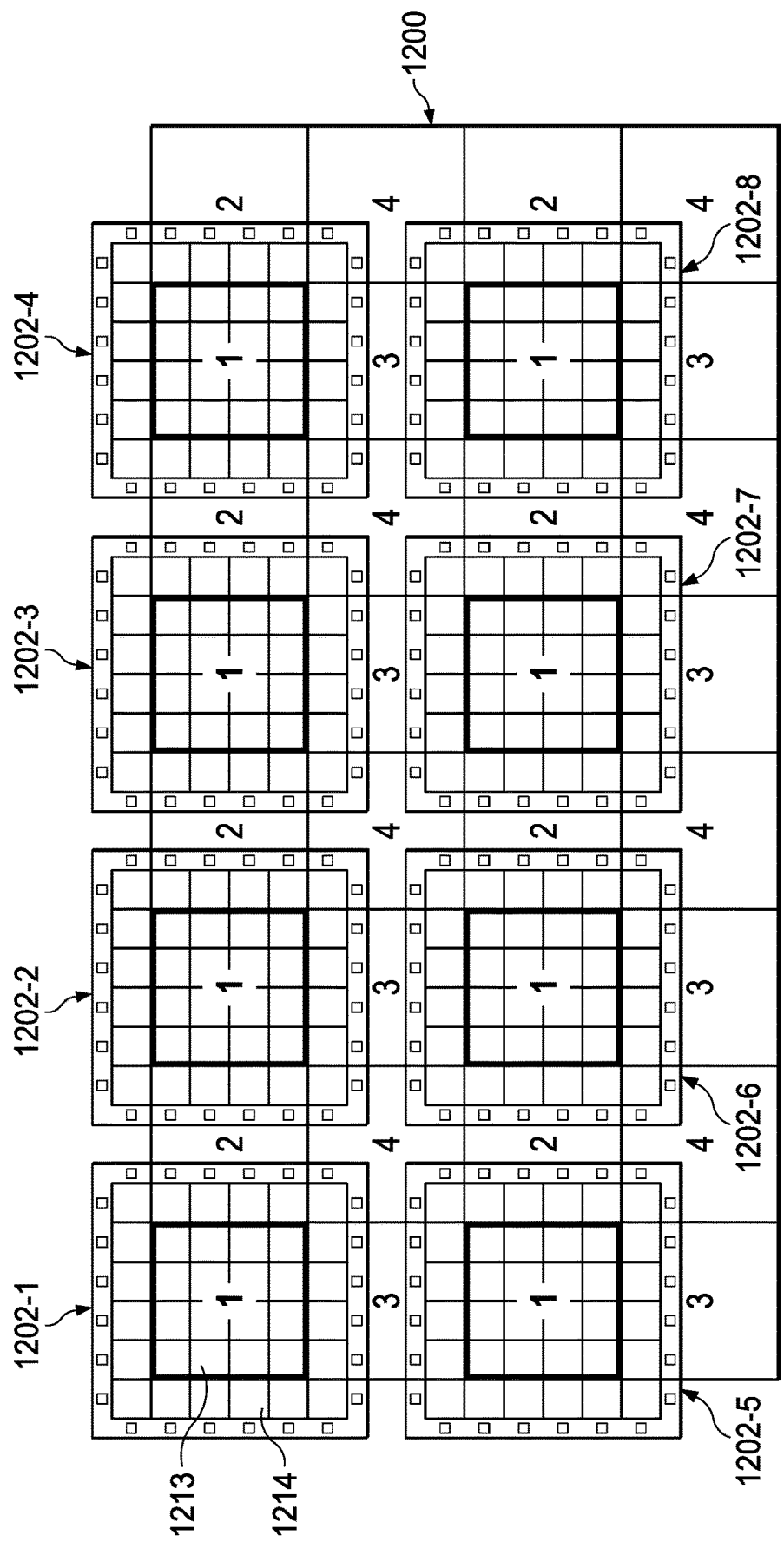
FIGS. 12A-D (collectively "FIG. 12") are diagrams of example positions of sensor arrays like the sensor array of FIG. 11.
Figure 12B:
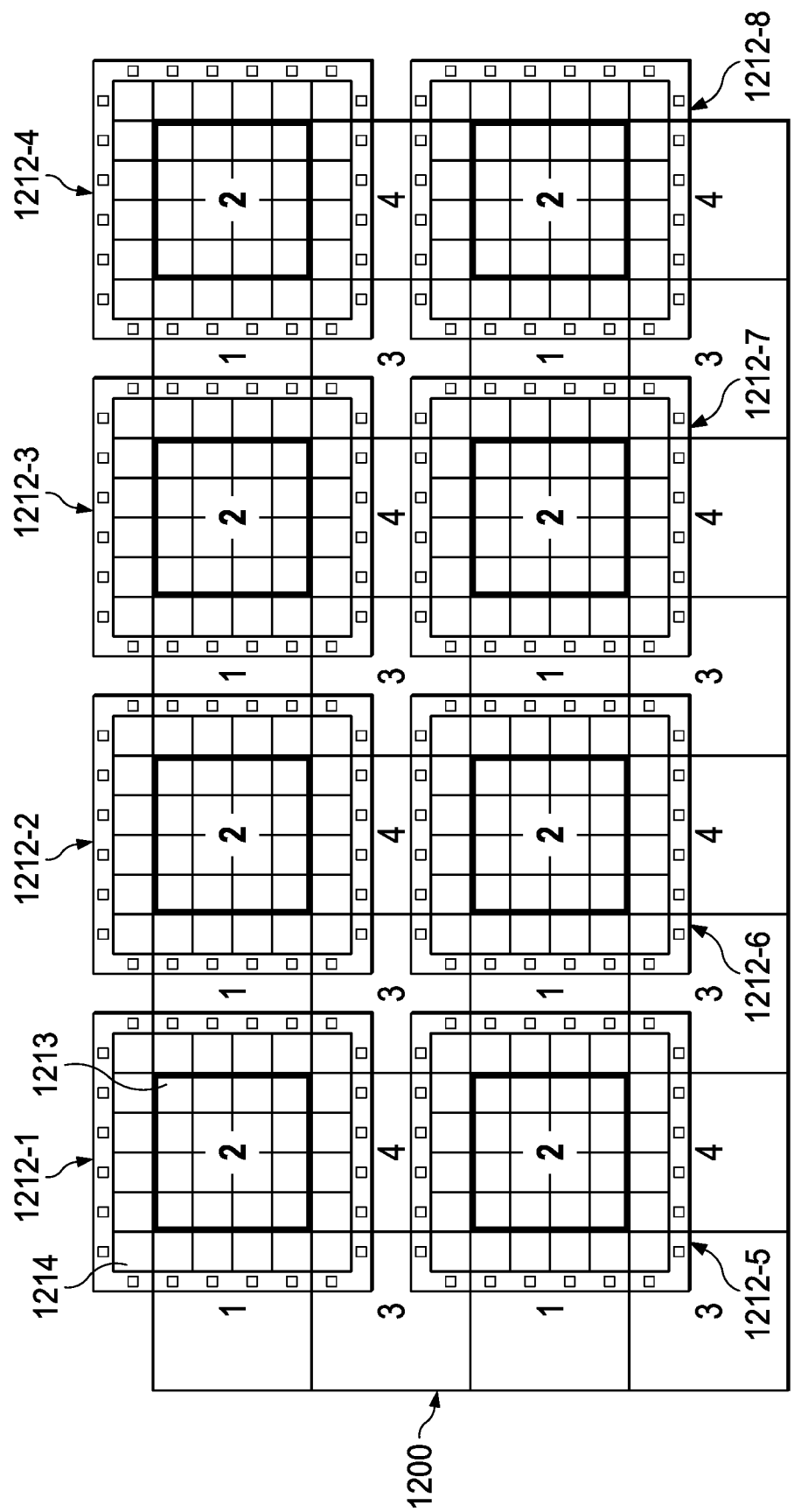
Figure 12C:
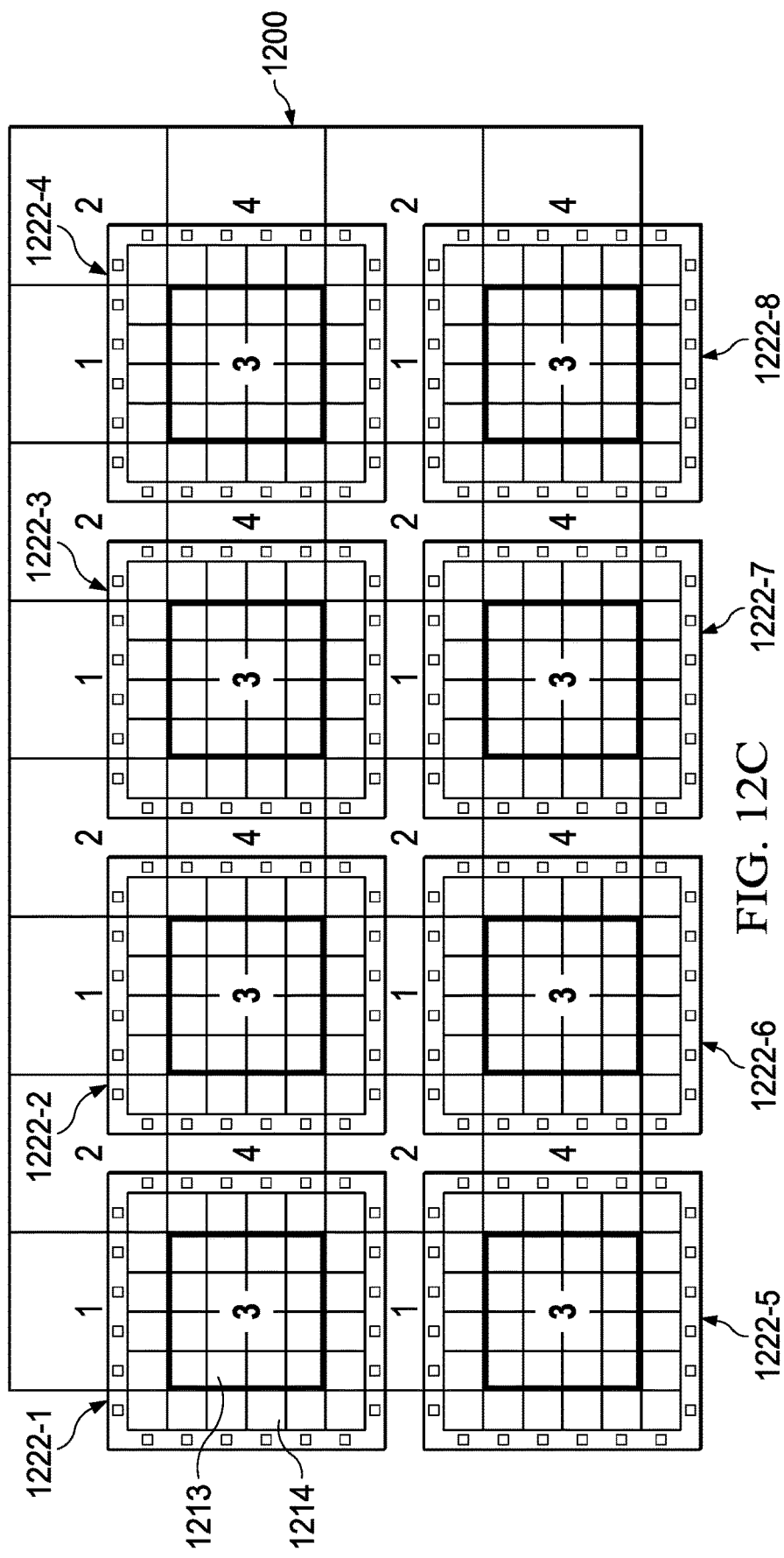
Figure 12D:
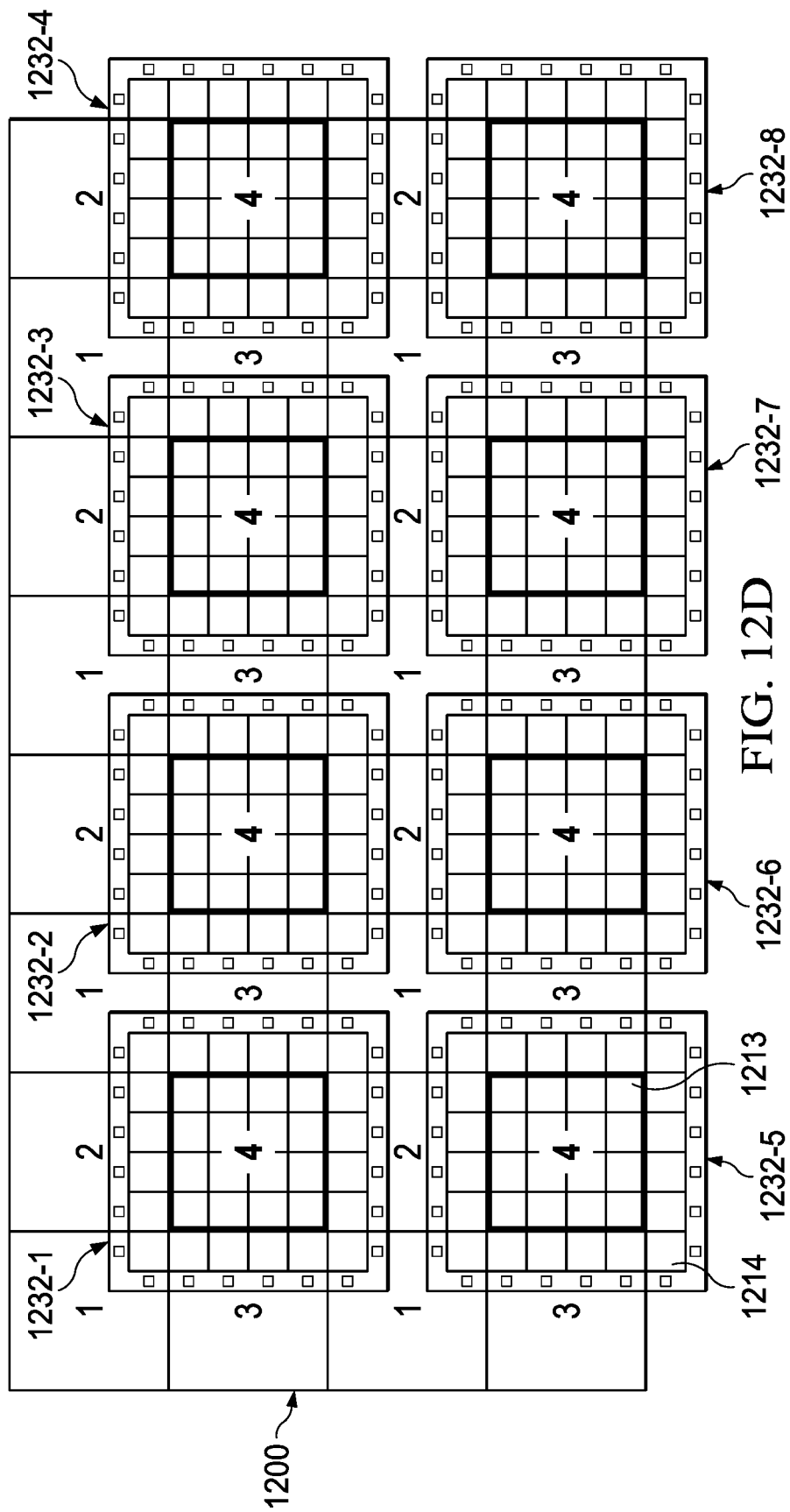

FIGS. 12A-D are diagrams of example positions of sensor arrays like sensor array 1100 (FIG. 11) within an arrangement like beam splitter 400 (FIG. 4). In this example, sensor elements 1202-1 through 1202-8 are like sensor elements 1102-1 through 1102-8 (FIG. 7) with circuit board 1104 omitted for clarity. Reflected light 1200 is like reflected light 600 (FIG. 6). Like reflected light 600, reflected light 1200 includes regions assigned to set 1, set 2, set 3 and set 4. In FIG. 12A, the position of a sensor array including sensor elements 1202-1 through 1202-8 is such that primary arrays 1212 of sensor elements 1202-1 through 1202-8 receive the reflected light from the regions in set 1. For example, if the sensor array 438 (FIG. 4) is the sensor array that contains sensor elements 1202-1 through 1202-8, the copy of the reflected light 402 provided by light 436 illuminates sensor array 438 (FIG. 4). However, the position of the primary array 1213 of sensor elements 1202-1 through 1202-8 are at the regions of set 1, as highlighted in FIG. 12A. Therefore, the primary arrays 1213 of the sensory array of FIG. 12A only sense the light of the regions of set 1. However, the surplus pixels 1214 of each of sensor elements 1202-1 through 1202-8 extend to an adjacent region. Thus, each surplus pixel 1214 senses light also sensed by a primary pixel for an adjacent region. This overlap allows for correction of misalignment between sensor arrays, as explained hereinbelow. Similarly, if sensor array 444 (FIG. 4) is the sensor array that contains sensor elements 1212-1 through 1212-8 of FIG. 12B, the position of the primary array 1213 of sensor elements 1212-1 through 1212-8 are at the regions of set 2. Therefore, the primary arrays 1213 of the sensor arrays of FIG. 12B only sense the reflected light of the regions of set 2. Similarly, if sensor array 424 (FIG. 4) is the sensor array that contains sensor elements 1222-1 through 1222-8 of FIG. 12C, the position of the primary array 1213 of sensor elements 1222-1 through 1222-8 are at the regions of set 3. Therefore, the primary arrays 1213 of the sensor arrays of FIG. 12C only sense the reflected light of the regions of set 3. Finally, if sensor array 428 (FIG. 4) is the sensor array that contains sensor elements 1232-1 through 1232-8 of FIG. 12D, the position of the primary array 1213 of sensor elements 1232-1 through 1232-8 are at the regions of set 4. Therefore, the primary arrays 1213 of sensor array of FIG. 12D only sense the reflected light of the regions of set 4.

Figure 13:
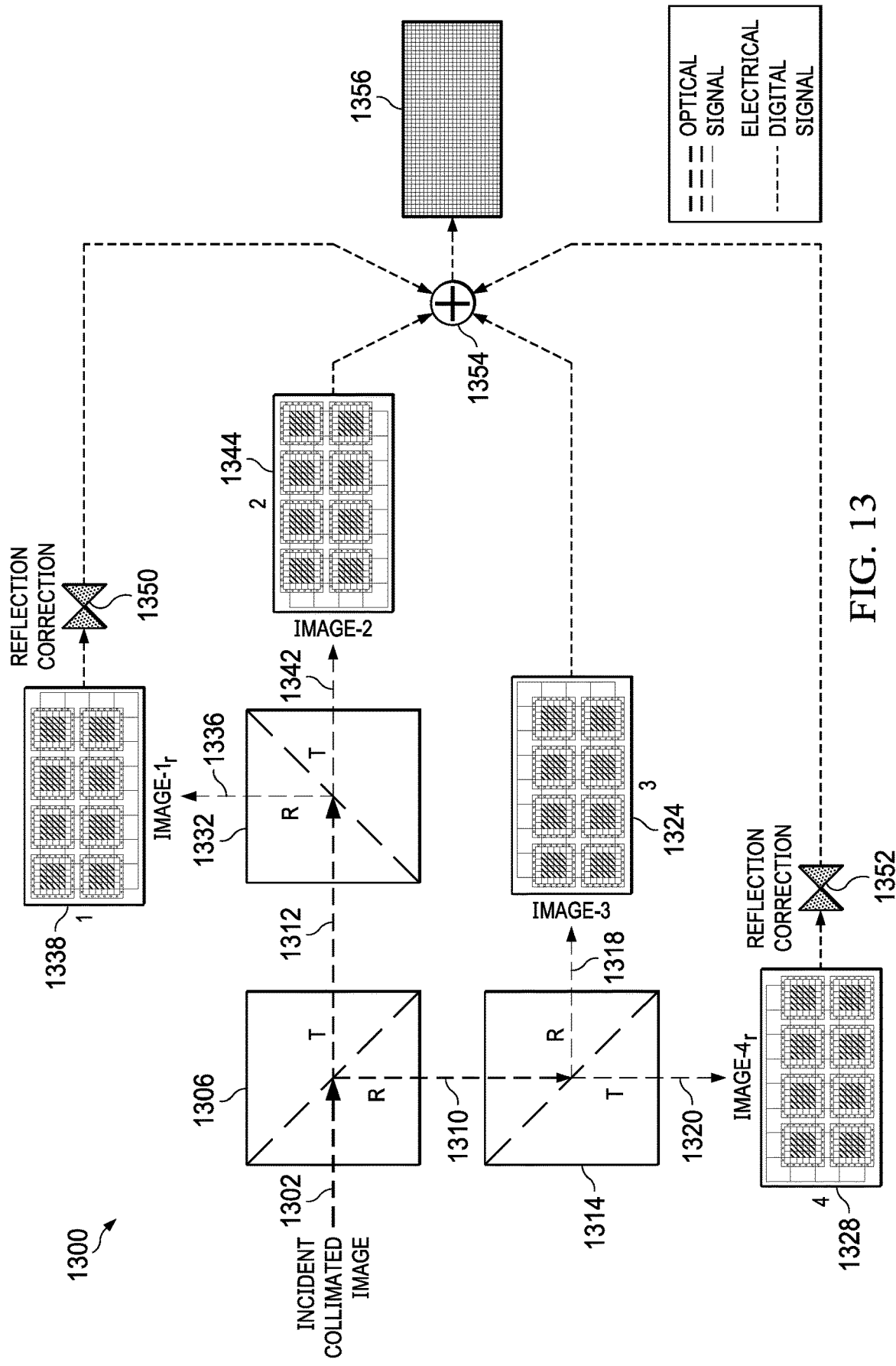
FIG. 13 is a schematic diagram of an example receive section.

FIG. 13 is a block diagram of an example receive section 1300 of a lidar using the configurations described hereinabove regarding FIGS. 10-12. Reflected light 1302 is reflected light from the scene. Beam splitter 1306 splits reflected light 1302 into light 1310 and light 1312. Beam splitter 1314 splits light 1310 into light 1318 and light 1320. Beam splitter 1332 splits light 1312 into light 1336 and light 1342. Sensor array 1338 receives light 1336 in the regions of set 1. Sensor array 1344 receives light 1342 in the regions of set 2. Sensor array 1324 receives light 1318 in the regions of set 3. Sensor array 1328 receives light 1320 in the regions of set 4. Because light 1336 and 1320 reflect once in beam splitters 1332 and 1306, respectively, the scene information of light 1336 and 1320 is the reverse of that of light 1318, which reflects twice in beam splitters 1306 and 1314, and light 1342, which does not reflect. Therefore, reflection corrector 1350 reverses the scene of light 1336 and reflection corrector 1352 reverses the scene of light 1320 in the electrical domain. Combiner 1354 combines the data provided by sensor arrays 1324, 1328, 1338 and 1344 to produce a complete image 1356. By assigning sensor arrays to sets of regions, where the regions are not adjacent to a region in the same set, allows for a near 100% fill factor of sensors in the image area, and allows for a relatively inexpensive sensor array configuration. In addition, the example of FIG. 13 captures the scene using no moving parts.

Figure 14:
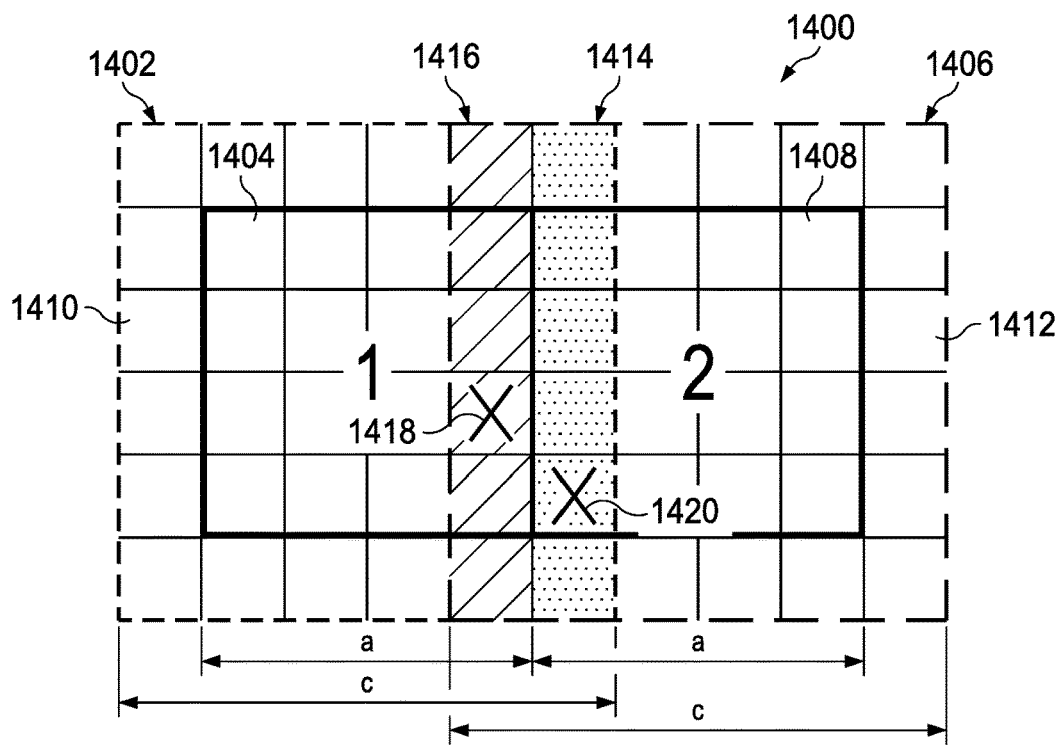
FIG. 14 is a detail diagram of two example adjacent regions within the receive section of FIG. 13.

FIG. 14 is a detail diagram of two example adjacent regions 1400 within receive section 1300 (FIG. 13). Sensor element 1402 detects the reflected light of region 1 by its primary pixels 1404. Sensor element 1406 detects the reflected light of region 2 by its primary pixels 1408. Sensor element 1402 and sensor element 1406 are like sensor element 1000 (FIG. 10) in that they include primary pixels like primary pixels 1006 and surplus pixels like surplus pixels 1008. In this example, surplus pixels 1410 and surplus pixels 1412 surround primary pixels 1404 and primary pixels 1408, respectively. In other examples use other positions for the surplus pixels. A portion of surplus pixels 1410 (labeled surplus pixels 1414) overlaps positions covered by primary pixels 1408 and some of surplus pixels 1412. An example of this overlap is pixel 1420. Similarly, a portion of surplus pixels 1412 (surplus pixels 1416) overlaps positions covered by primary pixels 1404 and some of surplus pixels 1410. An example of when one of surplus pixels 1412 overlaps primary pixels 1404 is pixel 1418. The width of primary pixels 1404 and 1408 is "a" as shown in FIG. 14. The overall width of sensor elements 1402 and 1406 is "c" as shown in FIG. 14. This shows the area of overlap between the two sensor elements.

Because some pixels overlap others, electronic correction of misalignment between sensor arrays can be performed; for example, between a sensor array covering region 1 and a sensor array covering region 2. Overlapping pixels (corresponding pixels) in each sensor array can be identified in respective reference frames (co-ordinate system). Using several of the overlapping surplus pixels allows for mapping common points and detecting multiple distortions between the images captured by the system for each set (that is, set 1, set 2, set 3 and set 4 in the described examples). The greater the number of overlapping pixels used, the greater the accuracy of the error detection. Typical errors are Translation: X and Y shifts between arrays and optical beams Rotation: Theta angles between arrays and optical beams (that is, one array may be turned relative to another)

Stretching & Shearing: Deformations in the image

Scale: Zoom level variations

Linear matrix transformations can identify these errors after fabrication of the receive unit (for example, receive section 1300). Similar matrix transformations (alignment correction factors) can correct the errors (distortions) on live images before merging the output of each sensor array. The mathematics and software for detecting and correcting these errors is known from image processing techniques. For example, the widely used image processing software Photoshop provided by Adobe Systems Incorporated includes modules to detect and correct for such distortions. These corrections can be applied to individual dies, or overall panels. To make the system more tolerant of larger errors, multiple overlapping surplus pixels are needed. For example, the area covered by surplus pixels will be the maximum translation error the system can handle. Having more surplus pixels than the solution variables in the computation of correction enables sub-pixel accuracy.

For example, designating one sensor array as a reference, the other panels are corrected/mapped to that reference. X' and Y' are the coordinates of an imaged pixel on the first sensor array to be corrected. If that panel has a shift error of Tx and Ty, along with a rotational error of θ, with respect to the reference sensor array as determined during calibration of the device, then the mapping of the corrected coordinates X and Y from the first sensor array to reference sensor array is given by Equation (1):

$$\begin{bmatrix} X \\ Y \\ 1 \end{bmatrix} = \begin{bmatrix} \cos\theta & -\sin\theta & TX \\ \sin\theta & \cos\theta & TY \\ 0 & 0 & 1 \end{bmatrix} \begin{bmatrix} X' \\ Y' \\ 1 \end{bmatrix} \quad (1)$$

Where X, Y is the corrected pixel position, θ is the rotation, TX is the translation in the X direction, TY is the translation in the Y direction and X', Y' are the uncorrected coordinates of the pixel position. Similar matrix transformations can correct for stretching, shearing, scaling and other errors. Such corrections are standard capabilities in image processing libraries and are part of the most vision system software used in applications such as lidar.

Figure 15:
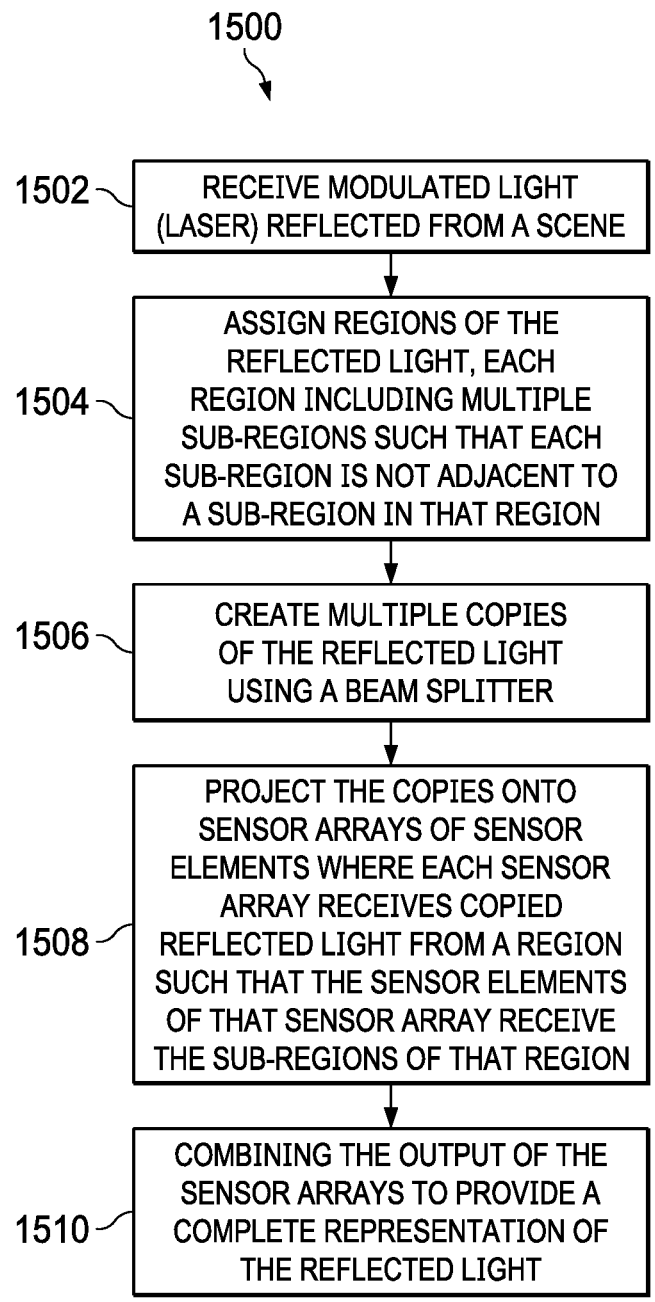
FIG. 15 is a process flow diagram of an example process.

FIG. 15 is a process flow diagram of an example process 1500. Step 1502 receives the laser light reflected from the scene. Step 1504 assigns regions of the reflected light where each region includes multiple sub-regions such that each sub-region in a region is not adjacent to another sub-region in that region. Step 1506 provides multiple copies of the reflected light using a beam splitter or multiple beam splitters. Step 1508 projects the copies onto sensor arrays of sensor elements where each sensor array receives copied reflected light from a region such that the sensor elements of that sensor array receive the sub-regions of that region. Step

1510 combines the output of the sensor arrays to provide a complete electronic representation of the reflected light.

Modifications are possible in the described examples, and other examples are possible, within the scope of the claims.

What is claimed is:

1. A receiver comprising:
   a beam splitter configured to split light into a first portion and a second portion;
   a first sensor array including first and second sensor integrated circuits and having a first sensor output, the first sensor integrated circuit including first photodiodes and the second sensor integrated circuit including second photodiodes, the first and second photodiodes being spaced apart, and the first sensor array is configured to:
     receive the first portion of the light;
     generate first signals via the first photodiodes, the first signals representing a first region of a scene;
     generate second signals via the second photodiodes, the second signals representing a second region of the scene; and
     provide the first and second signals at the first sensor output;
   a second sensor array including third and fourth sensor integrated circuits and having a second sensor output, the third sensor integrated circuit having third photodiodes and the fourth sensor integrated circuit having fourth photodiodes, the third and fourth photodiodes being spaced apart, and the second sensor array is configured to:
     receive the second portion of the light;
     generate third signals via the third photodiodes, the third signals representing a third region of the scene;
     generate fourth signals via the fourth photodiodes, the fourth signals representing a fourth region of the scene; and
     provide the third and fourth signals at the second sensor output; and
   a processing circuit having a processing output and first and second processing inputs, the first processing input coupled to the first sensor output, the second processing input coupled to the second sensor output, and the processing circuit configured to provide fifth signals representing an image of the scene responsive to the first, second, third, and fourth signals at the processing output.

2. The receiver of claim 1, wherein:
   the first and second sensor integrated circuits are on a first circuit board of the first sensor array;
   the first sensor integrated circuit is coupled to first contact pads on the first circuit board;
   the second sensor integrated circuit is coupled to second contact pads on the first circuit board;
   the first and second contact pads are in a space between the first and second sensor integrated circuits;
   the third and fourth sensor integrated circuits are on a second circuit board of the second sensor array;
   the third sensor integrated circuit is coupled to third contact pads on the second circuit board;
   the fourth sensor integrated circuit is coupled to fourth contact pads on the second circuit board;
   the third and fourth contact pads are in a space between the third and fourth sensor integrated circuits.

3. The receiver of claim 2, wherein each of the first, second, third, and fourth photodiodes include a respective array of photodiodes having a particular length;
   the first and second arrays of photodiodes are spaced apart on the first circuit board by a distance equal to the particular length; and
   the third and fourth arrays of photodiodes are spaced apart on the second circuit board by the distance.

4. The receiver of claim 2, wherein:
   the first region is adjacent the third region; and
   the second region is adjacent the fourth region.

5. The receiver of claim 4, wherein the third region is between the first and second regions, and the second region is between the third and fourth regions.

6. The receiver of claim 1, wherein the first, second, third, and fourth photodiodes are avalanche photodiodes.

7. The receiver of claim 1, wherein the beam splitter includes a cube beam splitter having a half-mirror layer.

8. A receiver comprising:
   a beam splitter configured to split light into a first portion, a second portion, a third portion, and a fourth portion;
   a first sensor array including first and second sensor integrated circuits and having a first sensor output, the first sensor integrated circuit including first photodiodes and the second sensor integrated circuit including second photodiodes, the first and second photodiodes being spaced apart, and the first sensor array is configured to:
     receive the first portion of the light;
     generate first signals via the first photodiodes, the first signals representing a first region of a scene; and
     generate second signals via the second photodiodes, the second signals representing a second region of the scene; and
     provide the first and second signals at the first sensor output;
   a second sensor array including third and fourth sensor integrated circuits having a second sensor output, the third sensor integrated circuit including third photodiodes and the fourth sensor integrated circuit including fourth photodiodes, the third and fourth photodiodes being spaced apart, and the second sensor array is configured to:
     receive the second portion of the light;
     generate third signals via the third photodiodes, the third signals representing a third region of the scene;
     generate fourth signals via the fourth photodiodes, the fourth signals representing a fourth region of the scene; and
     provide the third and fourth signals at the second sensor output;
   a third sensor array including fifth and sixth sensor integrated circuits and having a third sensor output, the fifth sensor integrated circuit including fifth photodiodes and the sixth sensor integrated circuit including sixth photodiodes, the fifth and sixth photodiodes being spaced apart, and the third sensor array is configured to:
     receive the third portion of the light;
     generate fifth signals via the fifth photodiodes, the fifth signals representing a fifth region of the scene;
     generate sixth signals via the sixth photodiodes, the sixth signals representing a sixth region of the scene; and
     provide the fifth and sixth signals at the third sensor output;
   a fourth sensor array including seventh and eighth sensor integrated circuits and having a fourth sensor output, the seventh sensor integrated circuit including seventh photodiodes and the eighth sensor integrated circuit including eighth photodiodes, and the fourth sensor array is configured to:
receive the fourth portion of the light;
generate seventh signals via the seventh photodiodes, the seventh signals representing a seventh region of the scene;
generate eighth signals via the eighth photodiodes, the eighth signals representing an eighth region of the scene; and
provide the seventh and eighth signals at the fourth sensor output; and
a processing circuit having a processing output and first, second, third, and fourth processing inputs, the first processing input coupled to the first sensor output, the second processing input coupled to the second sensor output, the third processing input coupled to the third sensor output, and the fourth processing input coupled to the fourth sensor output, the processing circuit configured to provide ninth signals representing an image of the scene responsive to the first through eighth signals at the processing output.

9. The receiver of claim 8, wherein:
the first and second sensor integrated circuits are on a first circuit board;
the first sensor integrated circuit is coupled to first contact pads on the first circuit board;
the second sensor integrated circuit is coupled to second contact pads on the first circuit board;
the first and second contact pads are in a space between the first and second sensor integrated circuits;
the third and fourth sensor integrated circuits is on a second circuit board;
the third sensor integrated circuit is coupled to third contact pads on the second circuit board;
the fourth sensor integrated circuit is coupled to fourth contact pads on the second circuit board;
the third and fourth contact pads are in a space between the third and fourth sensor integrated circuits;
the fifth and sixth sensor integrated circuits are on a third circuit board;
the fifth sensor integrated circuit is fifth contact pads on the third circuit board;
the sixth sensor integrated circuit is coupled to sixth contact pads on the second circuit board
the fifth and sixth contact pads are in a space between the fifth and sixth sensor integrated circuits;
the seventh and eighth sensor integrated circuits are on a fourth circuit board;
the seventh sensor integrated circuit is coupled to seventh contact pads on the fourth circuit board;
the eighth sensor integrated circuit is coupled to eighth contact pads on the fourth circuit board; and
the seventh and eighth contact pads are in a space between the seventh and eighth sensor integrated circuits.

10. The receiver of claim 9, wherein the first sensor integrated circuit includes photodiodes configured as first surplus pixels, and the second sensor integrated circuit includes photodiode configured as second surplus pixels.

11. The receiver of claim 10, wherein the processing circuit is configured to perform a misalignment correction operation between the first photodiodes and the second photodiodes based on sixth signals generated by the first surplus pixels and seventh signals generated by the second surplus pixels.

12. The receiver of claim 9, wherein:
each of the first through eighth photodiodes includes a respective array of photodiodes having a particular length;
the first and second arrays of photodiodes are spaced apart on the first circuit board by a distance equal to the particular length;
the third and fourth arrays of photodiodes are spaced apart on the second circuit board by the distance;
the fifth and sixth arrays of photodiodes are spaced apart on the third circuit board by the distance; and
the seventh and eighth arrays of photodiodes are spaced apart on the fourth circuit board by the distance.

13. The receiver of claim 9, wherein:
the first region is adjacent the third region;
the second region is adjacent the fourth region;
the fifth region is adjacent the seventh region; and
the sixth region is adjacent the eighth region.

14. The receiver of claim 13, wherein:
the third region is between the first region and the second region;
the second region is between the third region and the fourth region;
the seventh region is between the fifth region and the sixth region; and
the sixth region is between the seventh region and the eighth region.

15. The receiver of claim 8, wherein the first through eighth photodiodes are avalanche photodiodes.

16. The receiver of claim 8, wherein the beam splitter includes a cube beam splitter having a half-mirror layer.

17. The receiver of claim 8, wherein the beam splitter includes three cube beam splitters each having a half-mirror layer.

18. The receiver of claim 8, wherein the fifth region is adjacent the first region, and the sixth region is adjacent the second region.

19. A method comprising:
splitting light into a first portion and a second portion;
receiving the first portion of the light by first photodiodes of a first sensor integrated circuit and by second photodiodes of a second sensor integrated circuit, the first and second photodiodes being spaced apart;
generating first signals via the first photodiodes, the first signals representing a first region of a scene;
generating second signals via the second photodiodes, the second signals representing a second region of the scene;
receiving the second portion of the light by third photodiodes of a third sensor integrated circuit and by fourth photodiodes of a fourth sensor integrated circuit;
generating third signals with the third photodiodes, the third signals representing a third region of the scene;
generating fourth signals with the fourth photodiodes, the fourth signals representing a fourth region of the scene; and
generating fifth signals representing an image of the scene responsive to the first, second, third, and fourth signals.

20. The method of claim 19,
wherein the first region is adjacent the third region, and the second region is adjacent the fourth region.

21. The method of claim 19, wherein the light is split by a beam splitter.

22. The method of claim 19, wherein:
the first sensor integrated circuit includes photodiodes configured as first surplus pixels; and the second sensor integrated circuit includes photodiodes configured as second surplus pixels.

23. The method of claim 22, further comprising: determining an alignment correction factor between the first and second photodiodes based on sixth signals from the first surplus pixels and seventh signals from the second surplus pixels.

* * * * *